(12) United States Patent
Wang et al.

(10) Patent No.: US 12,174,243 B2
(45) Date of Patent: Dec. 24, 2024

(54) PROBE ASSEMBLY, SYSTEM AND METHOD FOR TESTING RF DEVICE OF PHASED ARRAY ANTENNA

(71) Applicant: TRON FUTURE TECH INC., Hsinchu (TW)

(72) Inventors: Yu-Jiu Wang, Hsinchu (TW); Hao-Chung Chou, Hsinchu (TW); Yue Ming Wu, Hsinchu (TW); Ta-Shun Chu, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 121 days.

(21) Appl. No.: 18/065,867

(22) Filed: Dec. 14, 2022

(65) Prior Publication Data
US 2024/0201245 A1    Jun. 20, 2024

(51) Int. Cl.
  *G01R 31/20* (2006.01)
  *G01R 1/067* (2006.01)
  *G01R 31/28* (2006.01)

(52) U.S. Cl.
  CPC ..... *G01R 31/2822* (2013.01); *G01R 1/06772* (2013.01)

(58) Field of Classification Search
  CPC ............ G01R 1/06772; G01R 1/06766; G01R 1/06788; G01R 31/2822; G01R 31/3191
  See application file for complete search history.

(56) References Cited

U.S. PATENT DOCUMENTS

| | | | | |
|---|---|---|---|---|
| 5,287,022 | A * | 2/1994 | Wilsher | G01R 31/31924 326/62 |
| 6,407,562 | B1 * | 6/2002 | Whiteman | G01R 1/06766 439/482 |
| 8,410,791 | B2 * | 4/2013 | Tsukagoshi | G01R 31/3004 324/606 |
| 8,863,311 | B1 | 10/2014 | Pai et al. | |
| 10,520,535 | B1 | 12/2019 | Lau et al. | |
| 2003/0057940 | A1 * | 3/2003 | Tanimura | G01R 31/31924 324/756.07 |

(Continued)

FOREIGN PATENT DOCUMENTS

| | | |
|---|---|---|
| CN | 102162824 B | 11/2014 |
| CN | 104297566 A | 1/2015 |
| TW | 201504629 A | 2/2015 |

OTHER PUBLICATIONS

First Office Action and search report issued Sep. 19, 2023 by Taiwan IPO.

(Continued)

*Primary Examiner* — Thang X Le
(74) *Attorney, Agent, or Firm* — WPAT, P.C.; Anthony King

(57) ABSTRACT

A method for manufacturing a first radio-frequency (RF) device, including: receiving a substrate having the first RF device, wherein the first RF device has a signal port for receiving or transmitting RF signals with an input impedance greater than ten times an input impedance of a testing tool; causing a probe assembly to connect to the signal port and the testing tool; and causing the probe assembly to connect to a first terminal of a resistive element having a resistance equal to the input impedance.

20 Claims, 29 Drawing Sheets

(56) References Cited

U.S. PATENT DOCUMENTS

| | | | |
|---|---|---|---|
| 2006/0220663 A1* | 10/2006 | Oikawa | G01R 31/2896 324/718 |
| 2010/0277190 A1* | 11/2010 | Reichel | G01R 1/06766 324/754.11 |
| 2011/0074389 A1* | 3/2011 | Knierim | G01R 1/06766 324/76.39 |
| 2012/0319697 A1 | 12/2012 | Gregg et al. | |
| 2015/0219688 A1 | 8/2015 | Jeon et al. | |
| 2018/0306838 A1* | 10/2018 | Peschke | G01R 1/06772 |

OTHER PUBLICATIONS

English abstract translation of the first office action and search report issued Sep. 19, 2023 by Taiwan IPO.
English abstract translation CN102162824.
English abstract translation CN104297566.
U.S. Pat. No. 8,863,311B1 corresponds to TW201504629.

\* cited by examiner

PROBE ASSEMBLY, SYSTEM AND METHOD FOR TESTING RF DEVICE OF PHASED ARRAY ANTENNA

BACKGROUND

In modern wireless communication technologies, satellite communications has attracted a lot of attention due to its advantages such as better signal coverage and high bandwidth as compared to conventional terrestrial communication technologies. It seems to be promising to incorporate the satellite communications into the popular cellular terrestrial communications to enhance the coverage and bandwidth of the wireless communication network. Further, the phased array antenna technology is usually adopted to work with the satellite communications for improving power efficiency for the relatively long transmission distance. However, the phase delays of the individual antenna devices in an antenna array should be well controlled with short delay and high accuracy, and thus the cost of the phased array antenna is still very high. Therefore, the commercialization of the satellite communication-based products is not satisfactory. As such, there is a need to develop a new phased array antenna and its testing method with an improved phase control design to lower its manufacturing cost.

SUMMARY

According to embodiments of the present disclosure, a method for manufacturing a first radio-frequency (RF) device includes: receiving a first RF device having a signal port for transmitting RF signals; arranging a first probe needle of a probe assembly to couple to the signal port; arranging a testing tool to couple to the probe assembly for testing the first RF device through the probe assembly; and arranging a first resistive element to couple to the first probe needle in parallel connection to make a first input impedance looking into the probe assembly from the testing tool substantially equal to a second input impedance looking into the testing tool from the probe assembly.

According to embodiments of the present disclosure, a probe assembly for testing a radio-frequency (RF) device includes: a first probe needle configured to contact a signal port of the RF device; a first connecting port configured to electrically connect to a second connecting port of a testing tool used for testing the RF device through the probe assembly; and a first resistive element configured to couple to the first probe needle in parallel connection to make a first input impedance looking into the first connecting port substantially equal to a second input impedance looking into the second connecting port.

According to embodiments of the present disclosure, a testing system includes a radio-frequency (RF) device having a signal port; a probe assembly having a probe needle coupled to the signal port; a testing tool having a first connecting port coupled to a second connecting port of the probe assembly, the testing tool used for testing the RF device through the probe assembly; and a resistive element configured to couple to the probe needle in parallel connection to make a first input impedance looking into the first connecting port substantially equal to a second input impedance looking into the second connecting port.

Through the arrangement of the proposed testing probe assembly, the testing system, and testing method for the phased array antenna, the task for testing the RF chip of the phased array antenna can be managed easily and more accurately, and thus the RF transmitter and receiver can be manufactured with less cost, and operated with less power. The device reliability can also be improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
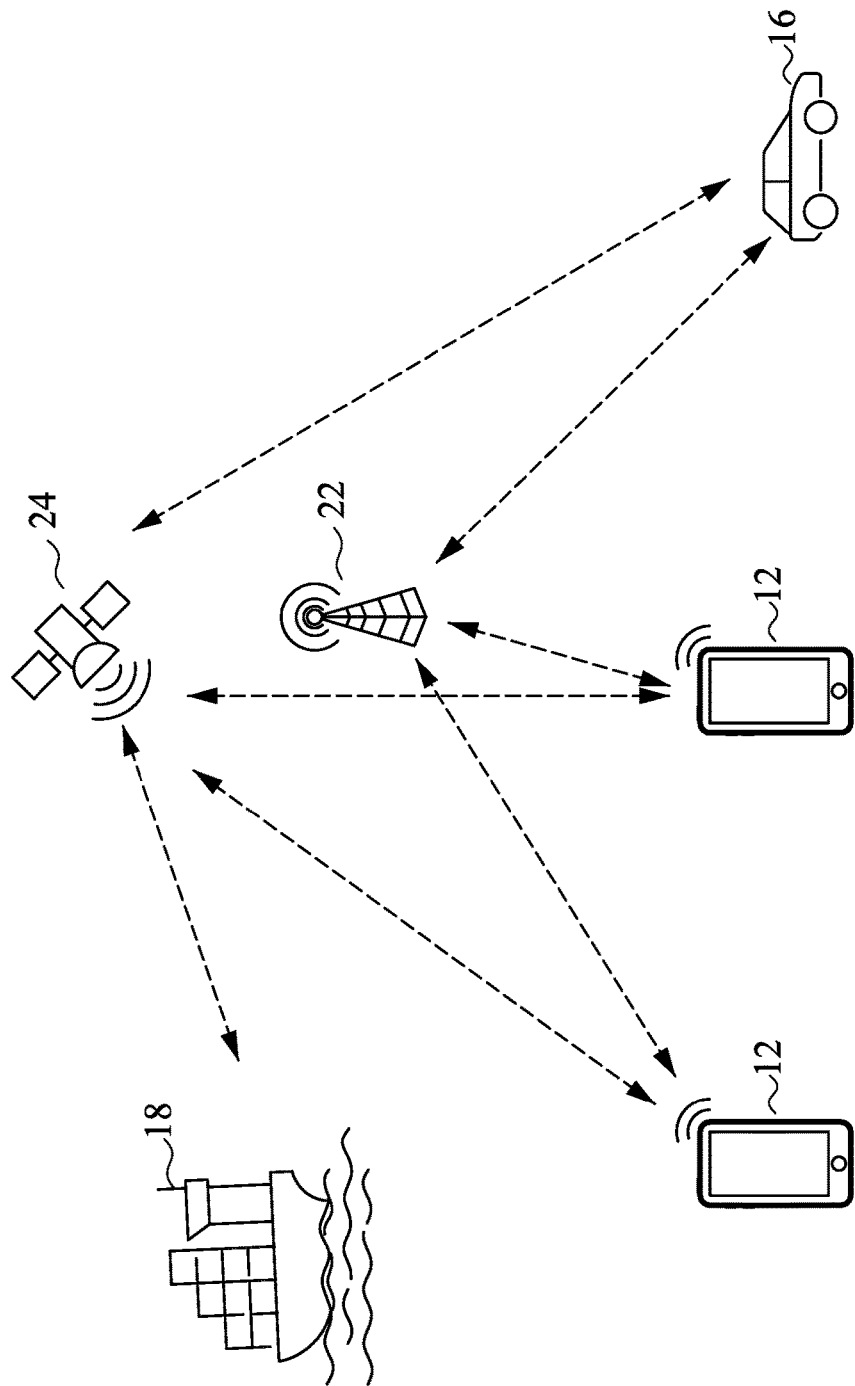
FIG. 1 is a schematic diagram showing a wireless communication system in a next-generation communication scenario, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

FIG. 1 is a schematic diagram showing a wireless communication system 10 in a next-generation communication scenario, in accordance with some embodiments of the present disclosure. The wireless communication system 10 includes one or more user devices 12, 14, 16 and 18, a terrestrial base station 22 and a non-terrestrial base station 24. In some embodiments, the user devices 12, 14 is carried and moved by a human, and are referred to as hand-held devices. In some embodiments, the user device 16 is a mobile device equipped in a vehicle moving on the land, such as a car, a train, or the like. In some embodiments, the user device 18 is a user device equipped in a ship moving in the sea, a river, or the like.

In some embodiments, the terrestrial base station 22 is an example of a base station deployed in a communication network, such as cellular communication network. The terrestrial base station 22 is configured to provide a communication network to the user devices 12, 14 and 16, in which the user devices 12, 14 and 16 can transmit or receive information between one another through the network established by a plurality of the terrestrial base stations 22. The terrestrial base station 22 may also be referred to as low-altitude platform. In some embodiments, the non-terrestrial based station 24 is an example of a communication satellite deployed in a communication satellite network. The non-terrestrial base station 24 is configured to provide a communication network to the user devices 12, 14, 16 and 18, in which the user devices 12, 14, 16 and 18 can transmit or receive information between one another via the satellite network. A plurality of the terrestrial base stations 22 and a plurality of the non-terrestrial base stations 24 can interlink to form a combined communication network, in which a global communication network can be realized to cover the user devices all over the world no matter where they are located, either in a low-altitude location, in a high-altitude location, or in any place not covered by the networks of the terrestrial base stations 22.

To achieve the goal of the global communication network exemplified by the wireless communication system 10, the user device 12, 14, 16 or 18 may need redesign to include a transmitter or a receiver with greater communication capability to communicate with the non-terrestrial base station 24 located in the high sky. Among the various transmitter or receiver designs, the phased array antenna technology is a promising solution to realize the beamforming technique, which can significantly increase the transmitter or receiving gain with greater reliability, and is suitable for satellite communication.

Figure 2A:
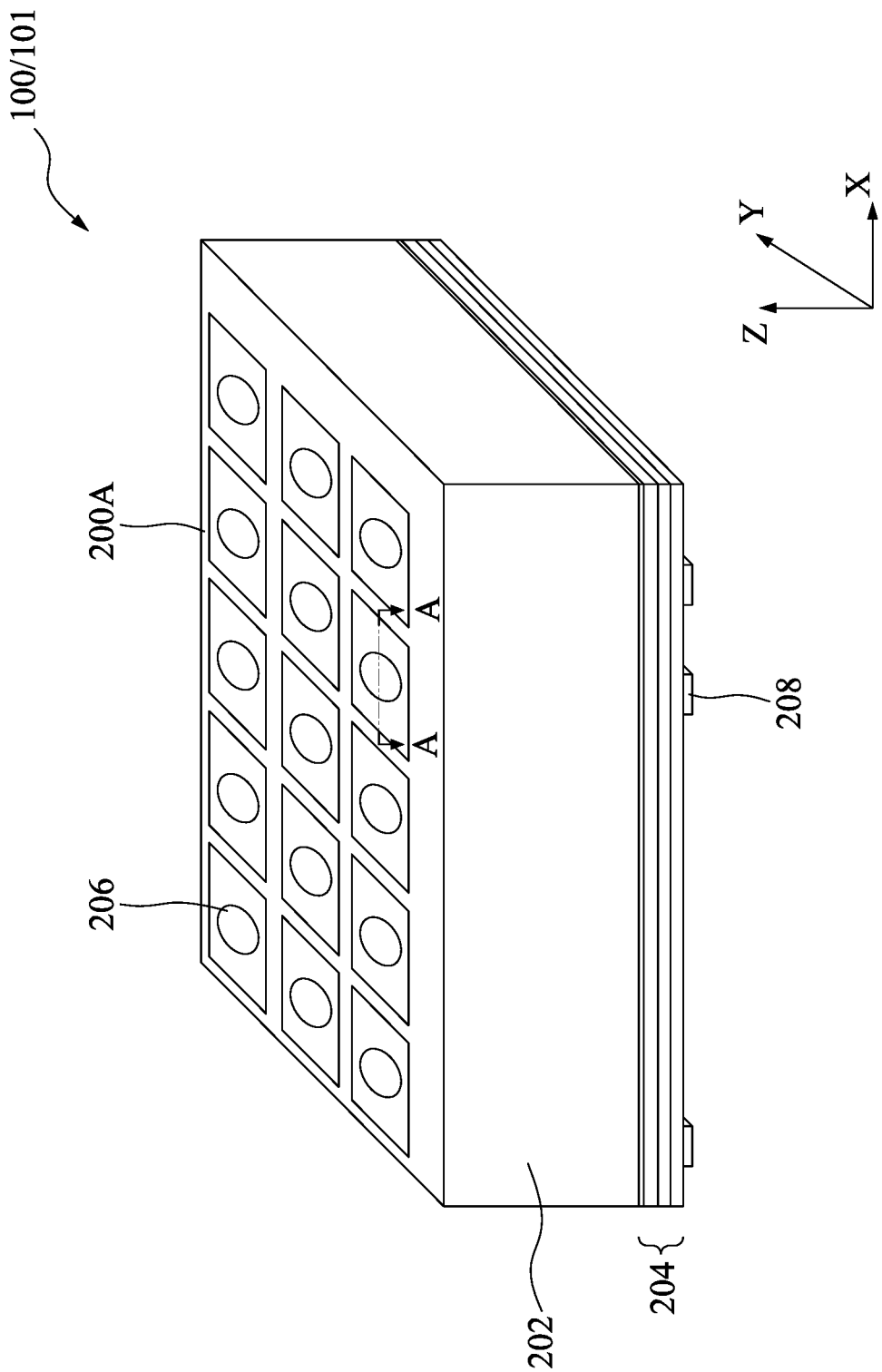
FIG. 2A is a schematic perspective view of an antenna array of a transmitter or receiver of a user device, in accordance with some embodiments.

FIG. 2A is a schematic perspective view of an antenna array of a transmitter 100 or a receiver 101 of the user device 12, 14, 16 or 18, in accordance with some embodiments. In some embodiments, the transmitter 100 is an RF transmitter or receiver. In some embodiments, the transmitter 100 or the receiver 101 serves as the transmitter or receiver of the terrestrial base station 22 or the non-terrestrial base station 24. In some embodiments, although not separately shown, the transmitter 100 or receiver 101 includes a control circuit board configured to generate and control the RF signals to be transmitted by the transmitter 100, or configured to receive and control and RF signals to be received by the receiver 101. In some embodiments, each of the user devices 12, 14, 16, 18, the terrestrial base station 22 and the non-terrestrial base station 24 includes a transmitter 100 and a receiver 101 with different operating frequencies, e.g., operating at about 28 GHZ and 18 GHz, respectively.

Referring to FIG. 2A, the transmitter 100 or receiver 101 includes an antenna array formed of a plurality of antenna elements 200A, in which antenna components, such as radiation elements 206, formed on a substrate 202 of an RF circuit board of the transmitter 100 or receiver 101. In some embodiments, each antenna device 200A includes a substrate 202 and an interconnect structure 204 arranged below the substrate 202. The interconnect structure 204 has a lower surface, and the substrate 202 has an upper surface. In some embodiments, the plurality of antenna device 200A share a common substrate 202 and a physically-connected interconnect structure 204, as shown in FIG. 2A. In some embodiments, an array of radiation elements 206 are formed on the upper surface of the substrate 202, while a plurality of RF chips 208 are arranged on the lower surface of the interconnect structure 204. The RF chips 208 may be interconnected through a plurality of conductive lines (not separately shown) on the lower surface of the interconnect structure 204. In some embodiments, the conductive lines may be encapsulated by an electrical insulating material or exposed through the surface of the interconnect structure 204. In some embodiments, each of the antenna devices 200A of the transmitter 100 or receiver 101 includes a patch antenna structure, and each radiation element 206 includes a patch structure of the antenna device 200A, such as in a circular, elliptical or oval shape, and is referred to as the antenna patch 206 of the respective antenna device 200A.

Figure 2B:
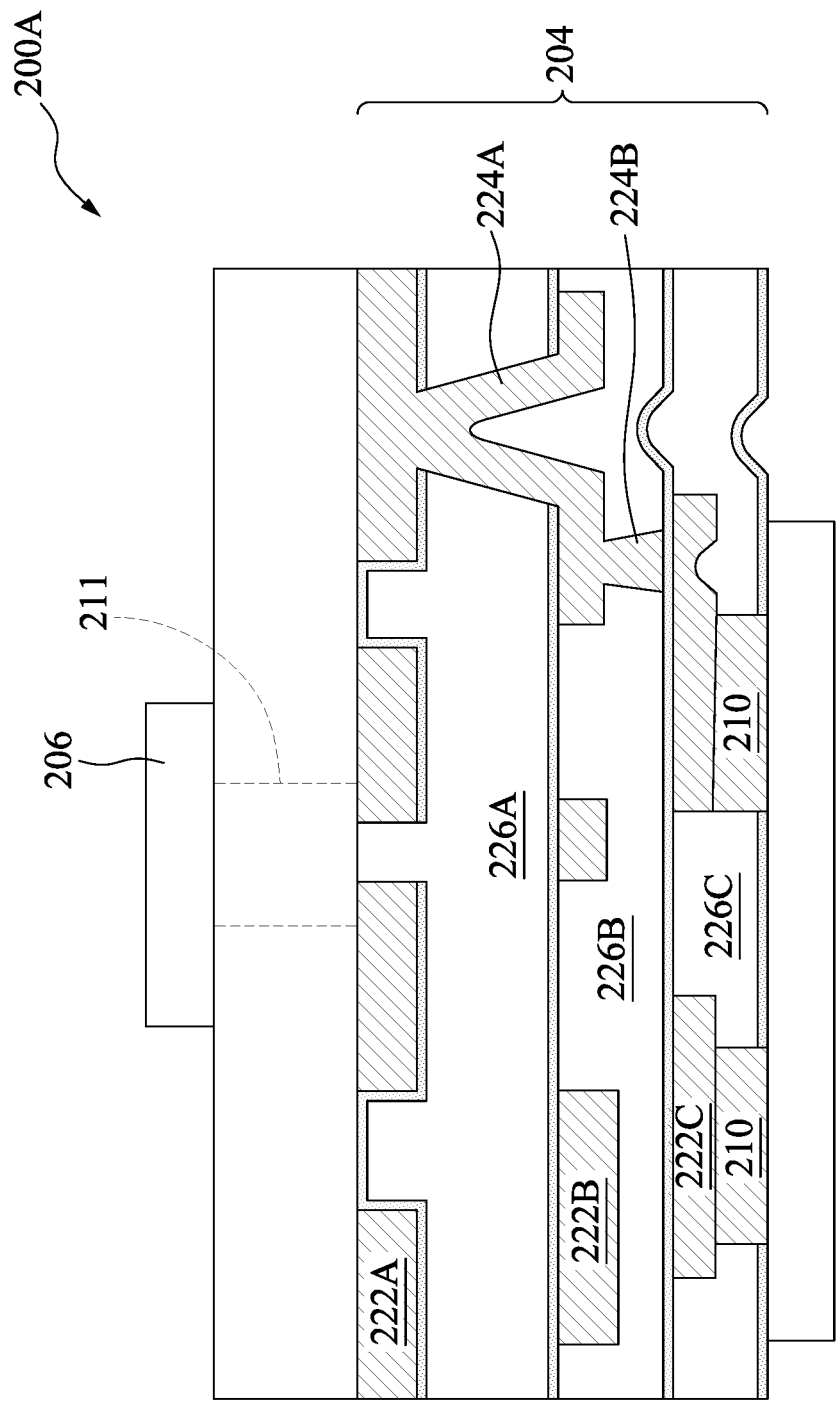
FIG. 2B is a schematic cross-sectional view of the transmitter or receiver shown in FIG. 2A, in accordance with some embodiments.

FIG. 2B is a schematic cross-sectional view of an antenna device 200A of the transmitter 100 or receiver 101 shown in FIG. 2A, in accordance with some embodiments. The cross-sectional view is taken along a sectional line AA of FIG. 2A. Referring to FIG. 2B, the substrate 202 is formed of a transparent material, such as glass, fused silica, silicon oxide, quartz, or the like. In some embodiments, the substrate 202 separates the antenna patches 206 from the electronic circuits of the interconnect structure 204 or RF chips 208. In some embodiments, RF signals are transmitted from the RF chip 208 formed on the lower side of the substrate 202, through the RF circuit formed in the interconnect structure 204, transmitted across a signal channel 211 in the transparent substrate 202, and coupled to the antenna patches 206 formed on the upper side of the substrate 202. In some embodiments, the antenna patch 206 includes additional patches on the circular or elliptical circumference of the antenna patch 206 to generate better field profile of an output RF signal. In some embodiments, the antenna patch 206 may be trimmed to include a truncated section or semicircle on the circular or elliptical circumference of the antenna patch 206 to seek better field profile of the output RF signal. The signal channel 211 may be formed of the transparent material of the substrate 202. In some embodiments, the thickness of the substrate 202 is determined based on the operation frequency of RF signal of the antenna devices 200A. in some embodiments, where the material of the substrate 202 is transparent to the RF signals, the substrate 202 may not need any conductive members within the projected area of the antenna patch 206 but still allows the interconnect structure 204 to be electromagnetically coupled to the antenna patches 206.

In some other embodiments, the substrate 202 is formed of non-transparent materials, such as elementary semiconductor material, e.g., bulk silicon. In some embodiments, the substrate 202 includes a conductive via formed in the signal channel 211 to electrically connect the RF circuit in the interconnect structure 204 to the antenna patch 206. As a result, the RF signals are transmitted between the RF chip 208, formed on the lower side of the substrate 202, and the antenna patches 206, formed on the upper side of the substrate 202, through the RF circuit, formed in the interconnect structure 204, and the conductive via in the signal channel 211 in the non-transparent substrate 202. In some embodiments, an isolation film is deposited between the conductive via and the surrounding silicon material of the substrate 202 to provide better electrical insulation.

In some embodiments, the interconnect structure 204 is formed of a plurality of metallization layers in a stack. The metallization layers include patterned conductive lines or conductive vias, and these patterned conductive lines and vias are patterned or electrically interconnected to form interconnection paths and other parts of the antenna device 200A. For example, a first metallization layer formed on the lower surface of the substrate 202 includes first conductive lines or pads 222A. The first conductive lines or pads 222A may be patterned as ground plates, and the remaining spaces may be formed as slits or apertures for coupling RF signals to or from the antenna patches 206. In some other embodiments, the lines or pads 222A are formed as signal contacts for transmitting the RF signals to or from the signal channel 211 in the non-transparent substrate 202.

A second metallization layer is formed below the first metallization layer and includes first conductive vias, e.g., an example first conductive via 224A. Likewise, a third metallization layer is formed below the second metallization layer and includes second conductive lines or pads 222B, and a fourth metallization layer is formed below the third metallization layer and includes a plurality of second conductive vias, e.g., an example second conductive via 224B. The second conductive lines 222B may be patterned to form power lines or signal transmission lines. A fifth metallization layer is formed below the fourth metallization layer and includes third conductive lines 222C. The third conductive lines 222C may be patterned to form transmission lines for communicating the RF signals or control signals between the ports of the RF chips 208. In some embodiments, the conductive lines 222A, 222B, 222C are interconnected through the conductive vias 224A and 224B. In some embodiments, a plurality of conductive pads 210 are arranged below the sixth metallization layer and electrically connecting the conductive lines 222C to the RF chips 208.

Please be noted that the RF chips 208 may be corresponding but not aligned with the respective antenna patches 206 due to routing considerations for the RF chip 208 and the antenna patch 206. The RF chips 208 are illustrated in FIG. 2B to be aligned with the antenna patches 206 just for illustrative purposes, and are not meant to dictate the necessary alignment between the antenna patch 206 and the respective RF chip 208.

In some embodiments, the conductive lines 222A, 222B, 222C and 210 and the conductive vias 224A and 224B are formed of conductive materials, such as copper, tungsten, aluminum, titanium, tantalum, alloys thereof, or the like. The conductive lines 222A, 222B, 222C and the conductive vias 224A and 224B are further electrically insulated by an insulating material 226A, 226B or 226C, such as a polymer-based material, e.g., polyimide or epoxy resin.

Figure 3A:
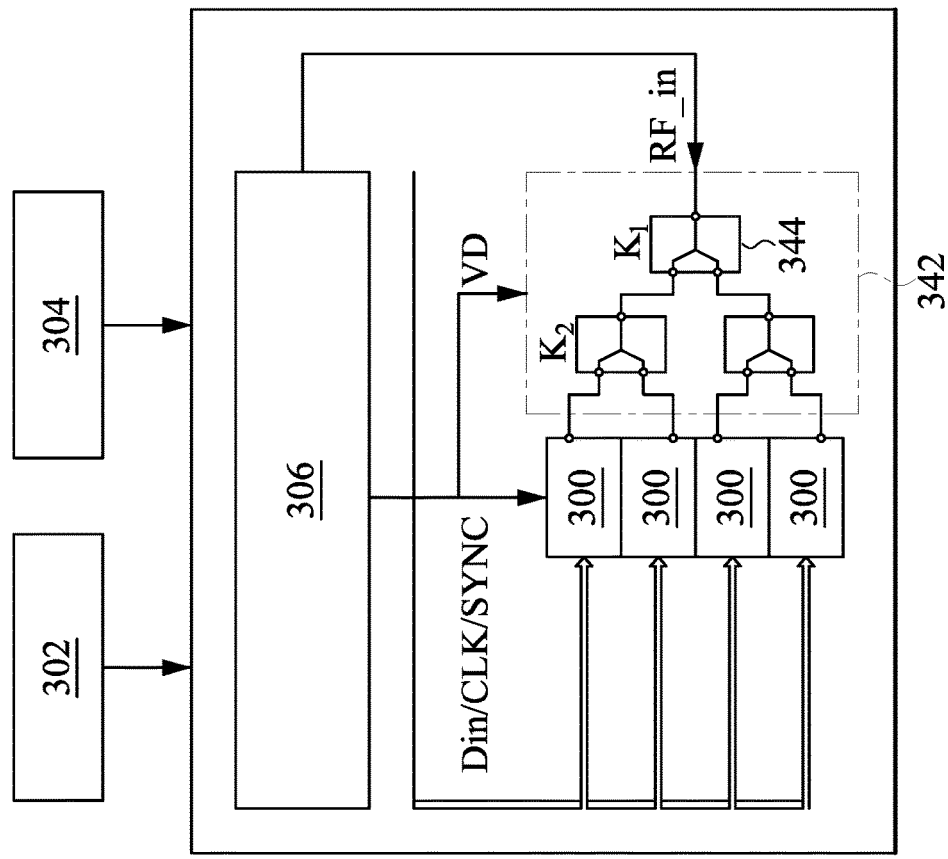
FIG. 3A is a schematic block diagram of a transmitter, in accordance with some embodiments.

FIG. 3A is a schematic block diagram of a transmitter 100, in accordance with some embodiments. In some embodiments, the transmitter 100 includes a processing unit 306, in which the processing unit 306 includes a power conversion module, a controller, and a data processing module (all not separately shown for brevity). The power conversion module is configured to provide a supply voltage VD, e.g., based on an input power received from an external power source 302. In some embodiments, the data processing module is configured to receive input data or commands from a control unit 304 external to the transmitter 100. In some embodiments, the data processing module includes a network interface circuit configured to receive or transmit data or commands under a transmission protocol. The processing unit 306 may be configured to extract the transmission data or the control signals from the input data.

In some embodiments, the controller is configured to generate one or more RF signals RF_in to be transmitted by the antenna patch 206. In some embodiments, the controller is further configured to generate the control signals for calibration of the RF signals RF_in, such as calibration data Din, a data clock signal CLK, and a synchronization clock signal SYNC. In some embodiments, the calibration data Din are used to calibrate the amplitude or phase of the RF signals RF_in according to the transmission data or commands. The calibration data may include amplitude calibration data or phase calibration data, or both. In some embodiments, the data clock signal CLK is used to provide a generic clock for the registers in the components of the transmitter 100. The frequency of the data clock signal CLK may represent the working frequency of the digital data processing in the transmitter 100. In some embodiments, the synchronization clock signal SYNC is used to provide a clock for some of the registers in different stages to output the calibration data at the same clock time. The synchronization clock signal SYNC may represent the update rate of the calibration data. In some embodiments, since the control signals include a digital form, they are also referred to as digital control signals.

In some embodiments, the transmitter 100 further includes a power divider networks 342, and a column of transmitter arrays 300. In some embodiments, the power divider network 342 is connected to the processing unit 306. In some embodiments, the power divider network 342 is a multistage power divider network formed of a plurality of power dividers 344 connected in a tree structure or binary structure. In some embodiments, the power divider network 342 includes two stages $K_1$ and $K_2$, and each power divider 344 in stage $K_1$ or $K_2$ is configured to distribute power of the RF signal RF_in substantially equally to the two outputs of the power divider 344. Each output of the power divider 344 at stage $K_2$ is connected to a corresponding transmitter array 300. In some embodiments, the power divider 344 can also be used as a power combiner in a receiver architecture, in which the input terminal and output terminals of the power divider 344 are reversed to be the output terminal and the input terminals of the power combiner.

In some embodiments, the control signals, including the calibration data Din, the data clock signal CLK and the synchronization clock signal SYNC, are provided to each of the transmitter arrays 300 through a bus or a plurality of signal lines. In some embodiments, the depicted embodiment only shows a two-stage power divider network 342. However, a power divider network 342 with a stage number greater or less than two can also be applicable to the transmitter 100 in other embodiments. In some embodiments, the depicted embodiment only shows four transmitter arrays 300 in one column of the transmitter arrays 300. However, a number of the transmitter arrays 300 in the column greater or less than four can also be applicable to the transmitter 100 in other embodiments, in which the number of the transmitter arrays 300 is scaled to the stage number of the power divider network 342.

Figure 3B:
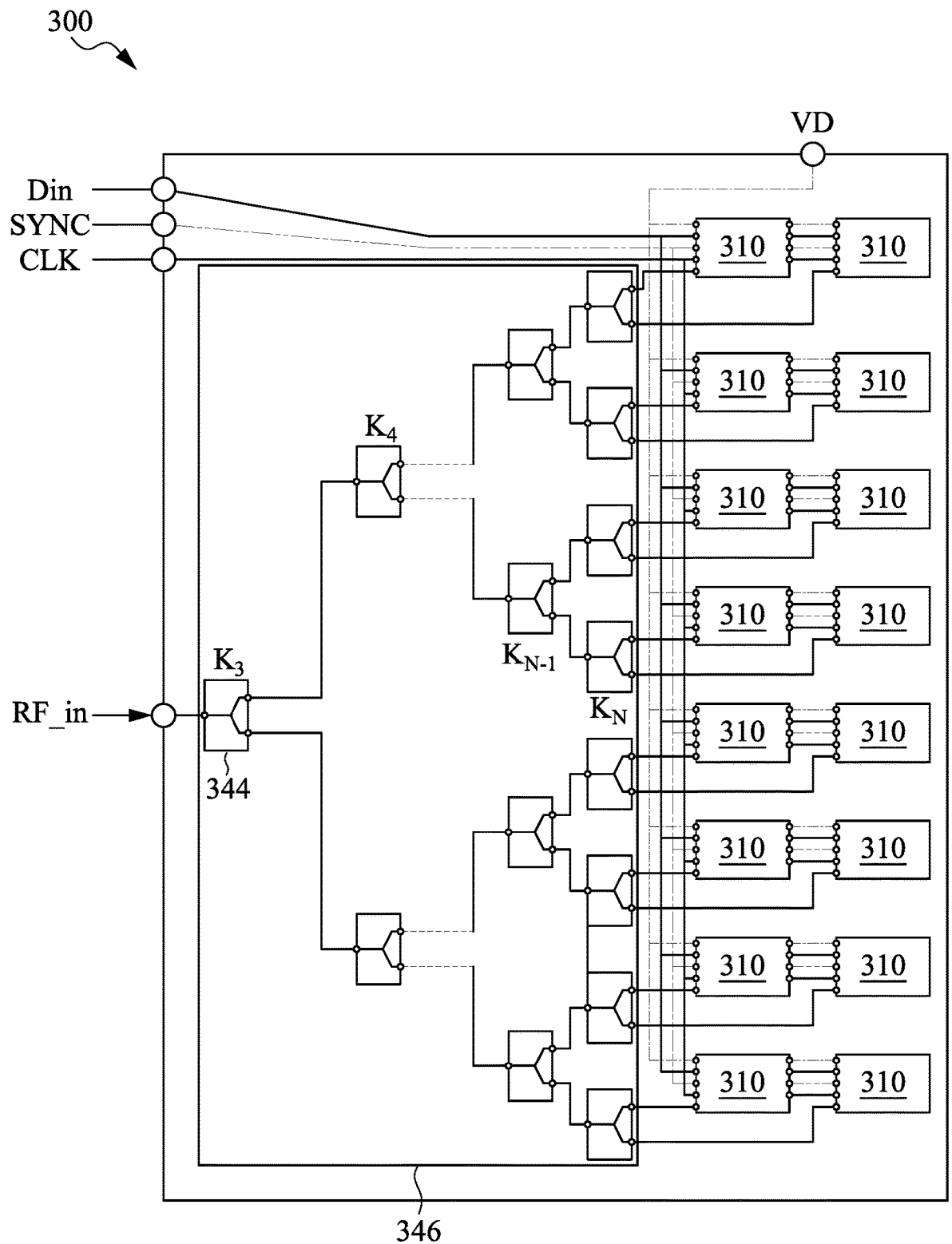
FIG. 3B is a schematic block diagram of a transmitter array of the transmitter shown in FIG. 3A, in accordance with some embodiments.

FIG. 3B is a schematic block diagram of a transmitter array 300 of the transmitter 100 shown in FIG. 3A, in accordance with some embodiments. In some embodiments, the transmitter array 300 includes another power divider network 346 and a plurality of transmitter blocks 310. In some embodiments, the power divider network 346 forms a combined N-stage power divider network with the power divider network 342, in which the power dividers 344 in the final stage $K_N$ of the power divider network 346 is connected to a corresponding transmitter block 310. In some embodiments, the power divider network 346 includes N−2 stages, and each power divider 344 in each stage is configured to distribute power of the RF signal RF_in at the input terminal substantially equally to the two output terminals of the power divider 344. In some embodiments, the supply voltage VD and the control signals Din, CLK, and SYNC are also provided to each of the transmitter blocks 310 through a bus or a plurality of signal lines.

Figure 3C:
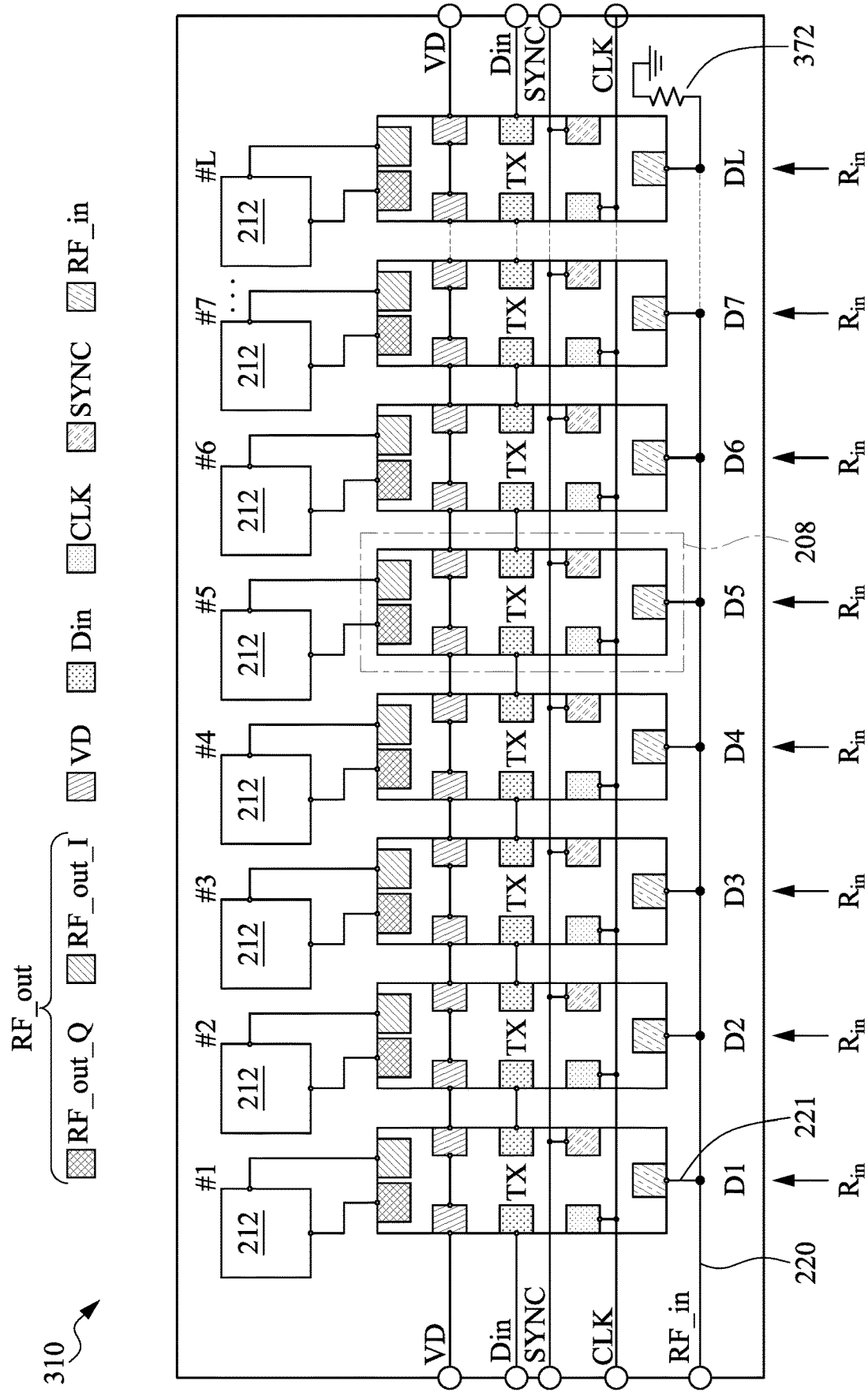
FIG. 3C is a schematic block diagram of a transmitter block of the transmitter array shown in FIG. 3B, in accordance with some embodiments.

FIG. 3C is a schematic block diagram of the transmitter block 310 of the transmitter array 300 shown in FIG. 3B, in accordance with some embodiments. In some embodiments, the transmitter block 310 is formed of a row of RF chips 208 and a row of antenna feed lines 212 corresponding to the row of RF chips 208. In some embodiments, as discussed earlier with reference to FIG. 2B, the RF chips 208 each include individual RF circuitries, and also referred to as RF circuits 208. In some embodiments, the supply voltage VD is provided and transmitted to each of the RF chips 208. Further, the control signals, including the calibration data Din, the data clock CLK and the synchronization clock SYNC, are fed into each RF chip 208 through one or more signal lines. In some embodiments, the RF signal RF_in is also fed into each RF chip 208 through a transmission line 220.

The RF chip 208 is configured to generate calibrated RF signals as an RF output signal RF_out after calibration of the RF signal RF_in is performed according to the calibration data Din. In some embodiments, the RF chip 208 includes input ports for the respective RF signal RF_in, the supply voltage VD, the calibration data Din, the data clock signal CLK and the synchronization clock signal SYNC. In some embodiments, the RF chip 208 includes output ports for the respective calibration data Dout and two components of the RF output signals RF_out as RF_out_I and RF_out_Q.

In some embodiments, the RF output signal RF_out is formed of the in-phase component RF_out_I and the quadrature component RF_out_Q corresponding to the horizontal (H)-polarization and vertical (V)-polarization components, respectively. The separate components RF_out_I and RF_out_Q represent the in-phase component RF_out_I and the quadrature component RF_out_Q, and they are in quadrature with each other. The separate quadrature components of the RF output signal may aid in calibration of the RF signal RF_in or the RF output signal RF_out.

In some embodiments, the transmission line 220 is arranged between the first terminal, i.e., the input port of the transmitter block 310 to be connected to an RF signal source, and a second terminal of the transmission line 220. In some embodiments, the second terminal of the transmission line 220 is connected to ground through a resistive element 372. The resistive element 372 may include a resistor. In some embodiments, the resistance of the resistive element 372 is determined to match the impedance of the transmission line 220 in order to eliminate signal reflection or a standing wave. In some embodiments, the resistive element 372 includes a resistance of about 50 ohm.

In some embodiments, the RF signal RF_in is propagated from the first terminal to the second terminal of the transmission line 220. In some embodiments, in a phased array antenna configuration, the adjacent antenna feed lines 212 are spaced apart by a predetermined antenna spacing. Furthermore, the RF output signals RF_out_I and RF_out_Q transmitted by the individual antenna feed lines 212 should be modulated with proper phase delays according to the phase adjustment data in the calibration data Din to collectively construct a directional RF signal beam. Therefore, each of the RF output signal components RF_out_I and RF_out_Q are phase modulated according to one or more design criteria, such as their locations in the antenna array.

In some embodiments, the RF chips 208 may not be arbitrarily arranged on the interconnect structure 204. In some embodiments, the row of RF chips 208 in the same transmitter block 310 are connected to different locations Di of the transmission line 220, where the index i represents the i-th RF chip 208 in the transmitter block 310, and 1<i<=L, where L can be any integer greater than 1. The locations Di are spaced apart by a predetermined distance. The signal feeding type of RF chips 208 in the transmitter block 310 using the single transmission line 220 is referred to as a "series-feed" signal feeding method. The RF signal RF_in may have phase differences among the different locations D1, D2, ... D7 ... DL of the transmission line 220. The undesired phase delays of the RF signal RF_in in different locations D1 through DL may be addressed and compensated for by the phase adjustment data of the calibration data Din at the same time. As a result, the issue of phase inaccuracy in the phased array antenna can be resolved without paying additional cost.

In some embodiments, the RF chip 208 is designed to include a high input impedance of the RF chip 208 when looked from an input port 208A of the RF chip 208. For example, the input impedance Rin of the RF chip 208 looked from the transmission line 220 into the RF chip 208 through the input port 208A of the RF chip 208 is relatively high, e.g., greater than ten times an input impedance of a testing tool. In some embodiments, the input impedance of the testing tool looked from a signal port of the testing tool is substantially 50 ohm.

Figure 3D:
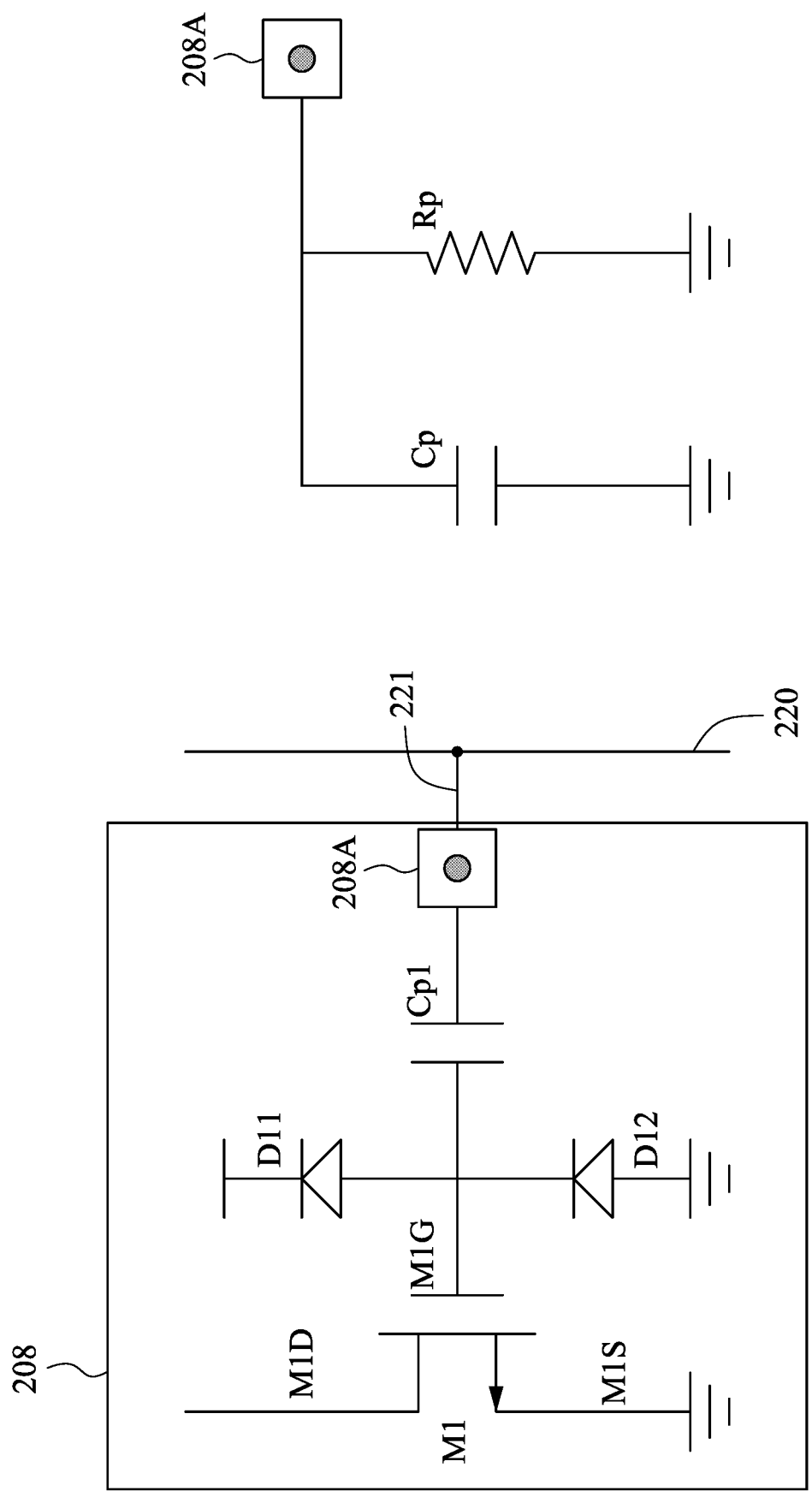
FIG. 3D is a schematic block diagram of an RF chip shown in FIG. 3C, in accordance with some embodiments.

FIG. 3D shows in a left subfigure a schematic block diagram of an RF chip 208 shown in FIG. 3C, in accordance with some embodiments. In some embodiments, an input port 208A of the RF chip 208 is connected to a field-effect transistor (FET) M1, e.g., metal-oxide-semiconductor FET (MOSFET), in which a gate terminal M1G or gate electrode is connected to the transmission line 220 through a branch transmission line 221. In some embodiments, the MOSFET M1 is connected to the input port 208A of the RF chip 208 through a capacitor Cp1. In some embodiments, the capacitor Cp1 is connected to diodes D11 and D12 of the RF chip 208 at the gate terminal M1G. Referring to a right subfigure of FIG. 3D, the circuits of the RF chip 208 connected to the input port 208A shown in the left subfigure can be represented by an equivalent circuit formed of the capacitator Cp in parallel connection with an input resistance Rp. In some embodiments, the input resistance Rp (or Rin) or the input impedance of the RF chip 208 is substantially equal to or greater than ten times the input impedance $Z_T$ of a testing tool, e.g., greater than about 500 ohm, in which the input impedance $Z_T$ is determined through looking into the testing tool through a signal port of the testing tool. In some embodiments, the input resistance Rp, equal to the input resistance Rin shown in FIG. 3C, is at least equal to or greater than 500 ohm, 1000 ohm, or 5000 ohm. In some embodiments, the abovementioned series-feed signal feeding type of the RF signal RF_in is accomplished through a voltage-driven signal feeding type. The RF output signal RF_out is generated based on a voltage signal transmitted at the gate terminal M1G of the input MOSFET M1, rather than a current-driven signal.

Based on the foregoing, the proposed series-type signal feeding method provides advantages. The current level flowing into the input port 208A of the RF chip 208 is very low due to the high-impedance nature of the MOSFET if leakage current can be managed well. Therefore, the power consumption of the RF chip 208 would be relatively low without compromising the device performance. Moreover, an additional phase calibration module for the transmitter block 310 is not necessary since the calibration data in the control signal already include phase calibration data in a phased array antenna architecture to aid in calibration of the RF signal RF_in, in which the adjustment of the delayed phases also covers phase adjustment or calibration.

Existing RF chip adopts transmission of the RF signals with a current-driven signal feeding type, which comes with a tree-type power divider network. Each of the power divider at the final stage of the tree-type power divider network is connected to a corresponding RF chip. The input terminal is designed to comply with the impedance matching rule, e.g., including an input impedance of about 50 ohm. Driving currents flow from the RF signal source into each of the RF chips through the tree-type power divider network. Such RF signal feeding architecture consumes power when the RF signal is being distributed to the RF chips at the endpoint of the power divider network. Although the phase errors among the RF chips of the current-driven signal feeding type may be less than the voltage-driven signal feeding type due to its substantially equal transmission lengths for all the RF chips with respect to the RF signal source, the process-induced device variations still often lead to unneglectable phase differences. Therefore, the phase calibration module is usually necessary to ensure the performance of the phased array antenna. In contrast, the proposed voltage-driven signaling type consumes less power and requires a lower number of the power dividers without compromising the device performance. The power, cost and reliability of the transmitter can thus be improved through the proposed antenna array structure.

The in-phase RF signal RF_out_I and the quadrature RF signal RF_out_Q are coupled to the antenna patch 206, combined and radiated outwardly through the antenna patch 206. The combined RF signal RF_out based on the in-phase RF signal RF_out_I and the quadrature RF signal RF_out_Q results in a circularly polarized RF signal RF_out. In some embodiments, the combined RF signal RF_out is a right-hand circularly polarized RF signal or a left-hand circularly polarized signal dependent upon the order of phases of the in-phase RF signal RF_out_I with respect to the quadrature RF signal RF_out_Q. In some embodiments, since the ideal circular polarization of the RF signal output RF_out is achieved with the equal amplitudes and the accurate phase difference of 90 degrees between the in-phase RF signal RF_out_I and the quadrature RF signal RF_out_Q, the effectiveness of the calibration data Din plays an important role. In some embodiments, the in-phase RF signal RF_out_I and the quadrature RF signal RF_out_Q are split before they are transmitted to the antenna patch 206 and subjected to the amplitude calibration and phase calibration independently. Further, in some embodiments, the in-phase RF signal RF_out_I and the quadrature RF signal RF_out_Q are received from the antenna patch 206 and subjected to the amplitude calibration and phase calibration independently in the RF chip 208 before they are combined and transmitted out of the RF chip 208. Therefore, the calibration task can be achieved easily without complicated calibration circuitry.

Figure 4A:
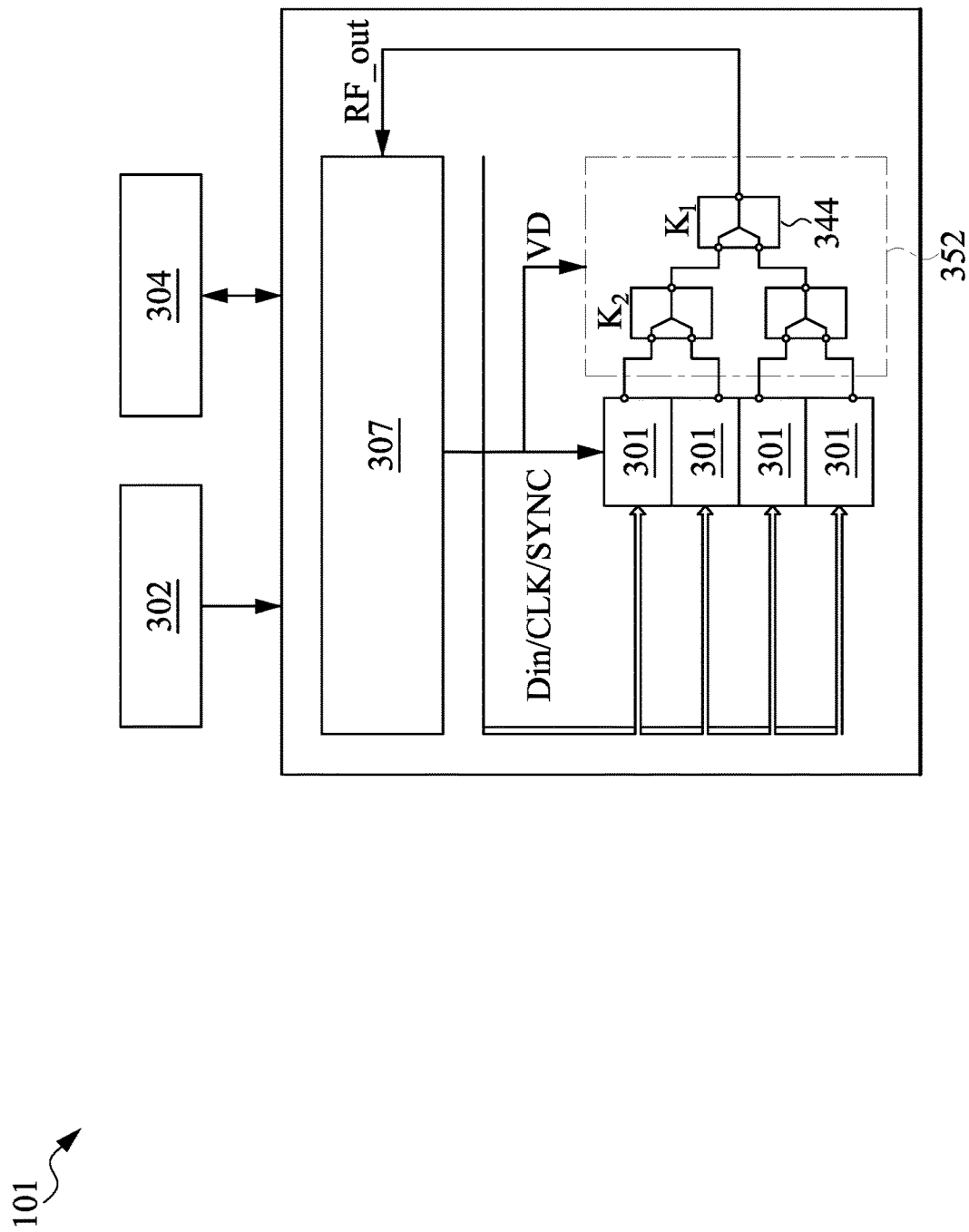
FIG. 4A is a schematic block diagram of a receiver, in accordance with some embodiments.

FIG. 4A is a schematic block diagram of a receiver 101, in accordance with some embodiments. In some embodiments, the receiver 101 is an RF receiver. In some embodiments, the receiver 101 is seen as a reciprocal device of the transmitter 100, in which the receiver 101 includes the processing unit 307. The receiver 101 may be different from the transmitter 100 in the operation frequency to facilitate duplex transmission, e.g., one of the transmitter 100 and receiver 101 is configured to operate at a frequency of 18

GHZ, while the other is configured to operate at a frequency of 28 GHz. The device design parameters for the transmitter 100 and receiver 101 may be different due to the different operating frequencies. In some embodiments, the receiver 101 is applicable to the user devices 12, 14, 16, 18, the terrestrial base station 22 or the non-terrestrial base station 24.

In some embodiments, the processing unit 307 includes a power conversion module, a controller, and a data processing module (all not separately shown for brevity). In some embodiments, additional modules may be added to the processing unit 307, or some of the abovementioned modules can be omitted or replaced by another module. The functions and configurations of the power conversion module of the processing unit 307 is similar to that of the transmitter 100 as described with reference to FIG. 3A, and thus the similar features are not repeated herein for brevity.

In some embodiments, the controller of the processing unit 307 is configured to control the demodulation of the receiver signal. In some embodiments, the receiver signal received by the processing unit 307 will be down-converted to a baseband signal. In some embodiments, the processing unit 307 is powered by the external power source 302. In some embodiments, the controller is configured to generate control signals for the phase array antenna, such as the calibration data Din, the data clock signal CLK, and the synchronization clock signal SYNC.

In some embodiments, the data processing module of the receiver 101 is configured to receive commands from a control unit 304 external to the receiver 101. The data processing module may be configured to receive transmission data extracted from the RF signal RF_out, and transmit the transmission data to the control unit 304.

The receiver 101 may further include a power combiner network 352 and a column of receiver arrays 301. In some embodiments, the power combiner network 352 is connected to the input of the processing unit 307 and configured to collect the RF signal RF_in from each RF chip 209 (see FIG. 4C) into a combined RF data signal RF_out. The power combiner network 352 shown in FIG. 4A is a multistage power combiner network similar to the power divider network 342 shown in FIG. 3A, except that the input terminals and output terminals thereof are reversed. In some embodiments, the control signals, including the calibration data Din, the data clock signal CLK and the synchronization clock signal SYNC, are provided to each of the receiver arrays 301 through a bus or a plurality of signal lines.

Figure 4B:
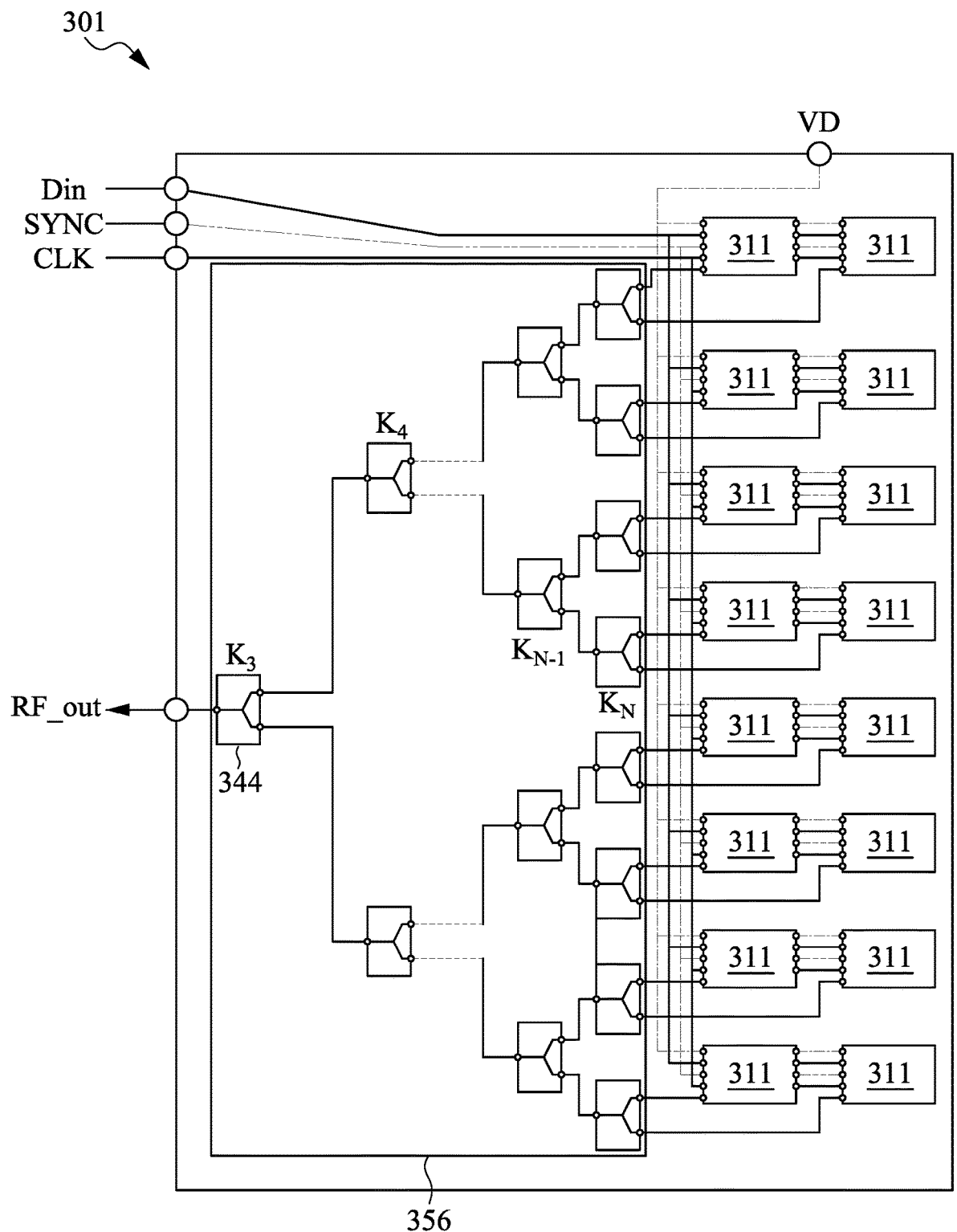
FIG. 4B is a schematic block diagram of a receiver array of the receiver shown in FIG. 4A, in accordance with some embodiments.

FIG. 4B is a schematic block diagram of a receiver array 301 of the receiver 101 shown in FIG. 4A, in accordance with some embodiments. In some embodiments, the receiver array 301 includes another power combiner network 356 and a plurality of receiver blocks 311. In some embodiments, the power combiner network 356 shown in FIG. 4B is similar to the power divider network 346 shown in FIG. 3B, except that the input terminals and the output terminals thereof are reversed. In some embodiments, the supply voltage VD and the control signals, including the calibration data Din, the data clock signal CLK and the synchronization clock signal SYNC, are also provided to each of the receiver blocks 311 through a bus or a plurality of signal lines.

Figure 4C:
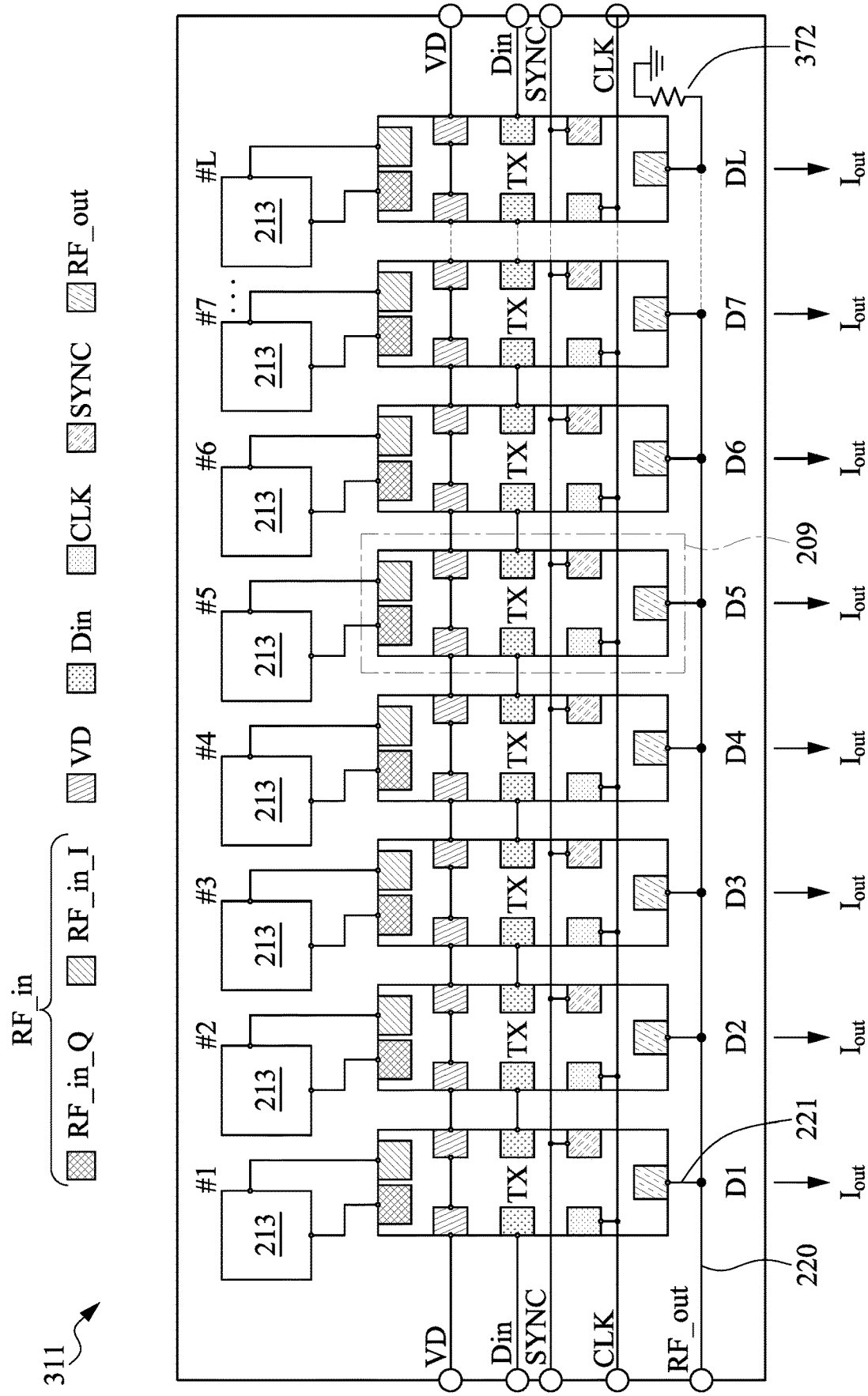
FIG. 4C is a schematic block diagram of a receiver block of the receiver array shown in FIG. 4B, in accordance with some embodiments.

FIG. 4C is a schematic block diagram of a receiver block 311 of the receiver array 301 shown in FIG. 4B, in accordance with some embodiments. In some embodiments, the receiver block 311 is formed of a row of RF chips 209 and a row of antenna feed lines 213 corresponding to the row of RF chips 209. In some embodiments, as discussed earlier with reference to FIG. 2B, the RF chips 209 each include individual RF circuitries, and also referred to as RF circuits 209. In some embodiments, the supply voltage VD is provided and transmitted to each of the RF chips 209. Further, the control signals, including the calibration data Din, the data clock signal CLK and the synchronization clock signal SYNC, are fed into each RF chip 209.

The RF chip 209 is configured to provide a calibrated RF signal RF_out from an RF input signal RF_in on the antenna feed lines 213 according to the calibration data Din. In some embodiments, the RF chip 209 includes input ports for the respective in-phase RF signal component RF_in_I and the quadrature RF signal component RF_in_Q, the supply voltage VD, the calibration data Din, the data clock signal CLK and the synchronization clock signal SYNC. In some embodiments, the RF chip 209 includes output ports Dout for the respective calibration data and the RF signals RF_out. The functions and configurations of the calibration data Din, the data clock signal CLK and the synchronization clock signal SYNC are similar to those described with reference to FIGS. 3A to 3C, and details of these features are not repeated herein.

In some embodiments, receiver block 311 include a transmission line 220 between the first terminal, i.e., the output port of the receiver block 311, and a second terminal of the transmission line 220. In some embodiments, the second terminal of the transmission line 220 is connected to ground through a resistive element 372. The resistive element 372 may include a resistor. In some embodiments, the resistance of the resistive element 372 is determined to match the impedance of the transmission line 220 in order to eliminate signal reflection. In some embodiments, the resistive element 372 includes a resistance of about 50 ohm.

In some embodiments, the provided RF signals RF_out are propagated between the first terminal and the second terminal of the transmission line 220. The RF signals provided by the individual antenna feed lines 213 should be demodulated with proper phase delays according to the phase adjustment data in the calibration data Din to collectively form a constructive RF signal RF_out. Therefore, before the RF signal components RF_in_I and RF_in_Q are combined or before the individual RF signals RF_out is fed to the transmission line 220, they are phase calibrated according to one or more design criteria, such as their locations in the antenna array.

Figure 4D:
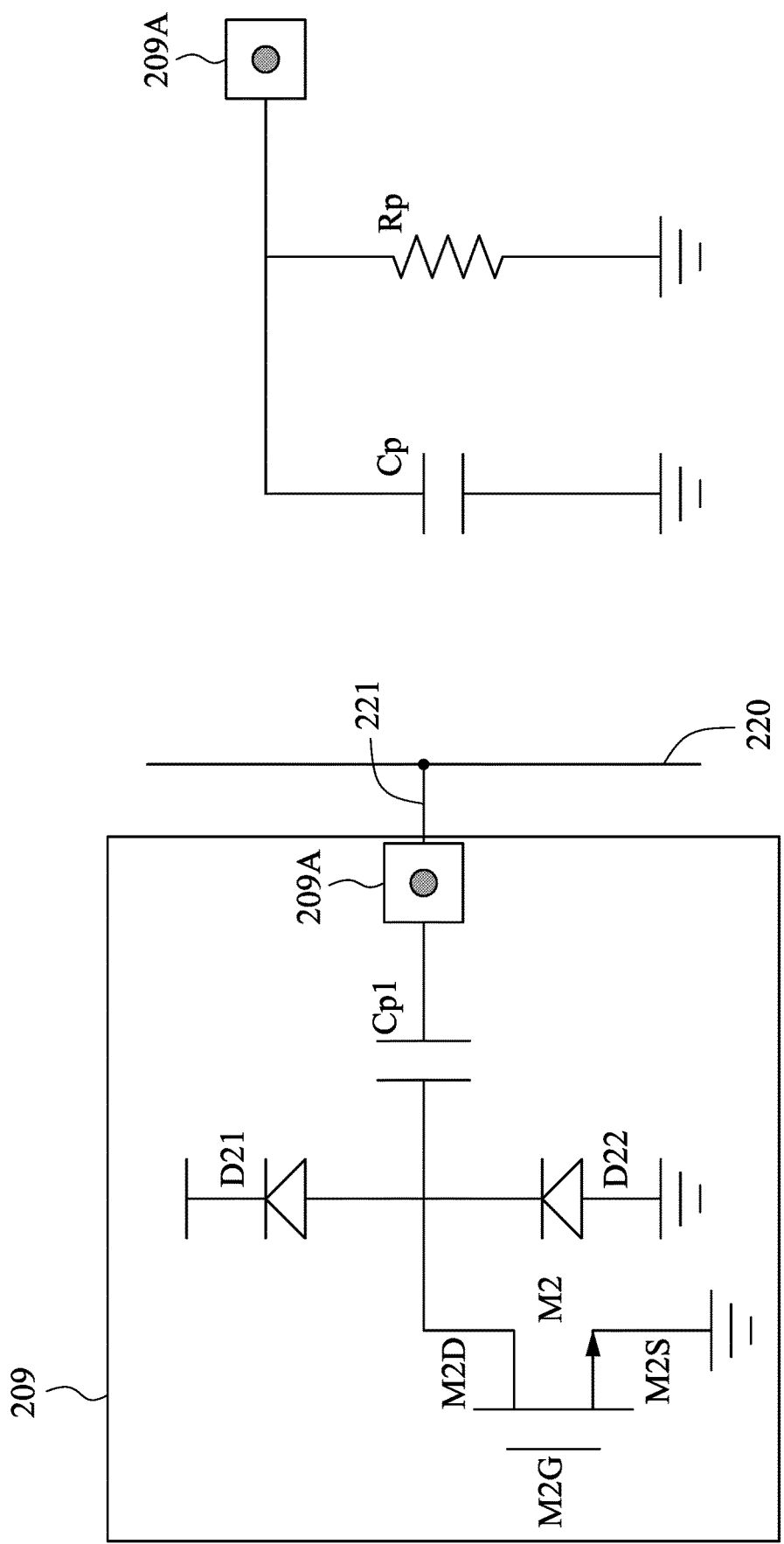
FIG. 4D is a schematic block diagram of an RF chip shown in FIG. 4C, in accordance with some embodiments.

FIG. 4D shows in a left subfigure a schematic block diagram of an RF chip 209 shown in FIG. 4C, in accordance with some embodiments. In some embodiments, the output port 209A of the RF chip 209 is formed of a FET M2, in which a drain terminal M2D is connected to the transmission line 220 through a branch transmission line 221. In some embodiments, the output port 209A of the RF chip 209 is designed to include a relatively high input impedance to ensure the majority of the output current $I_{out}$ of the received RF signal RF_out provided from one RF chip 209 to the transmission line 220 would not flow back to other RF chips 209 of the same receiver block 311.

In some embodiments, the MOSFET M2 is connected to the output port 209A of the RF chip 209 through a capacitor Cp1. In some embodiments, the capacitor Cp1 is connected to diodes D21 and D22 of the RF chip 209 at the drain terminal M2D. Referring to a right subfigure of FIG. 4D, the circuits of the RF chip 209 connected to the input port 208A shown in the left subfigure can be represented by an equivalent circuit formed of the capacitator Cp in parallel connection with an input resistance Rp. In some embodiments, the input impedance or resistance Rp of the RF chip 209 is substantially equal to or greater than ten times the input impedance $Z_T$ of a testing tool, e.g., greater than about 500 ohm. In some embodiments, the input resistance Rp of the RF chip 209 is at least equal to or greater than 500 ohm, 1000 ohm, or 5000 ohm.

Based on the foregoing, the proposed series-type signal accumulating method provides advantages. The current level flowing from one RF chip 209 to other RF chips 209 in the same receiver block 311 is very low due to the high-impedance nature of the MOSFET if leakage current can be managed well. Therefore, the power collection efficiency of the RF chip 209 would be relatively high without compromising the device performance. Moreover, an additional phase calibration module for the receiver block 311 is not necessary since the calibration data in the control signal already include phase calibration data in a phased array antenna architecture to aid in calibration of the RF signal RF_in (including the in-phase RF signal component RF_in_I and the quadrature RF signal component RF_in_Q), in which the adjustment of the delayed phases also covers phase adjustment or calibration.

Figure 5A:
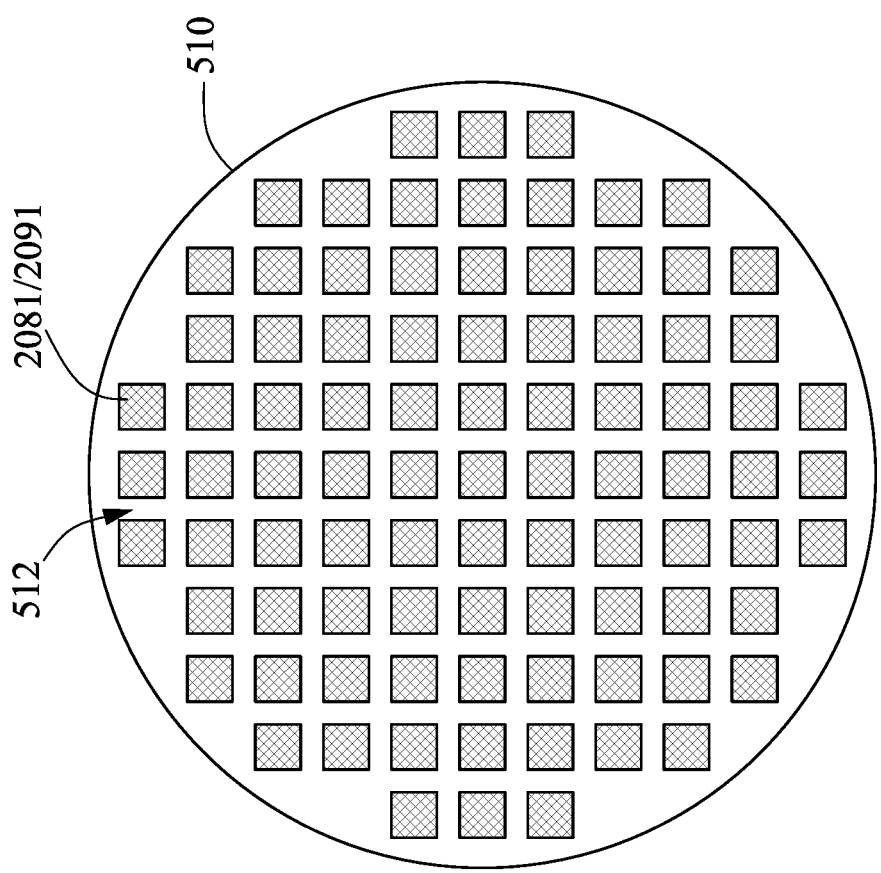
FIGS. 5A to 5D are schematic block diagrams of intermediate stages of a method of manufacturing a phased array antenna, in accordance with some embodiments.

FIGS. 5A to 5D are schematic block diagrams of intermediate stages of a method of manufacturing and testing a phased array antenna of the transmitter 100 or the receiver 101, in accordance with some embodiments. FIG. 6 is a schematic flowchart of a method 600 of manufacturing and testing the phased array antenna shown in FIGS. 5A to 5D, in accordance with some embodiments. It shall be understood that additional steps can be provided before, during, and after the steps in method 600, and some of the steps described below can be replaced with other embodiments or eliminated. The order of the steps shown in FIG. 5A to 5D or in FIG. 6 may be interchangeable. Some of the steps may be performed concurrently or independently.

In some embodiments, the manufacturing of the phased array antenna includes fabrication of the phased array antenna, followed by a testing operation of the fabricated phased array antenna to ensure the integrity of the phased array antenna. Referring to FIG. 5A, a substrate 510 including a first RF device 2081 or 2091 is received. The relative step is shown in step S602 of FIG. 6. In some embodiments, the substrate 510 includes a plurality of RF devices 2081 or 2091, including the first RF device 2081 or 2091, formed in an array on an upper surface of the substrate 510. In some embodiments, the plurality of RF devices 2081 or 2091 are separated and defined by scribe line areas 512. The RF device 2081 or 2091 is similar to the RF chip 208 or 209 except that the RF device 2081 or 2091 is still left on a substrate together with other RF devices 2081 or 2091 prior to a dicing or singulation operation, while the RF chip 208 or 209 is a standalone chip formed from the RF device 2081 or 2091 and can be bonded to the transmitter block 310 or the receiver block 311. In some embodiments, the RF device 2081 or 2091 is tested before subjecting to a dicing or singulation process to evaluate the electrical property of the RF chip 208 or 2091 bonded to the transmitter block 310 or the receiver block 311.

In some embodiments, the scribe line areas 512 include testing patterns or testing ports configured to perform testing on the RF devices 2081 or 2091 after the RF devices 2081 or 2091 are formed. In some embodiments, each of the RF devices 2081/2091 has a signal (input/output) port 208A/209A for receiving/transmitting RF signals with an input impedance Rp greater than ten times an input impedance $Z_T$ of a testing tool, e.g., the testing tool 502 shown in FIG. 5B, in which the input impedance Rp is determined through looking into the signal port 208A or 209A of the RF devices 2081 or 2091 from the probe needle 508, while the input impedance $Z_T$ is determined through looking into the testing tool 502 from a signal port (or connecting port) 525 of the testing tool 502. In some embodiments, the input port 208A of the RF device 2081 is used in an RF transmitter, while the output port 209A of the RF device 2091 is used as an RF receiver. Throughout the present disclosure, the input port 208A and the output port 209A are collectively referred to as signal ports.

Figure 5B:
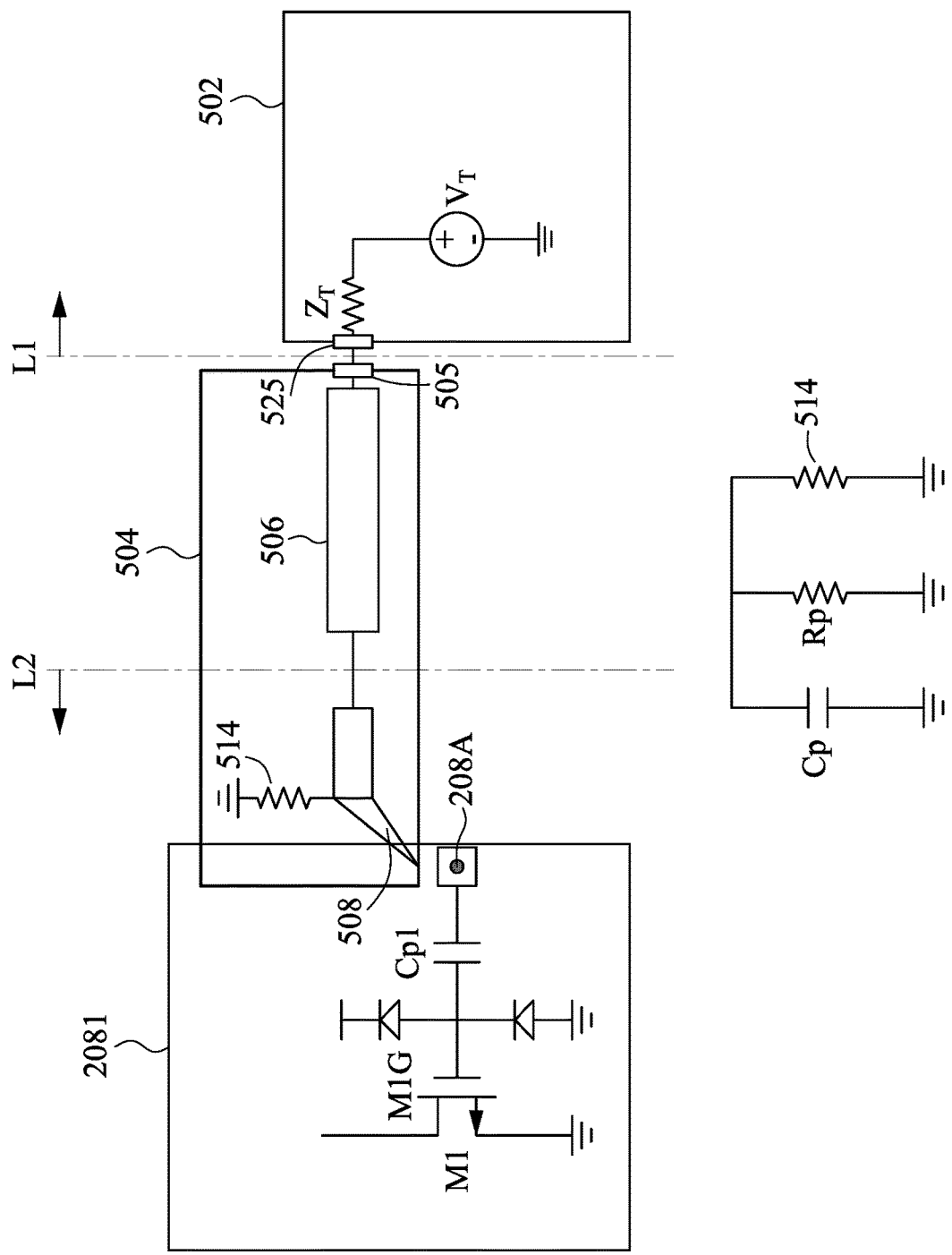

Referring to FIG. 5B, a probe assembly 504 is caused to connect to the input port 208A and the testing tool 502 for testing the RF device 2081 or 2091. In some embodiments, the probe assembly 504 includes a probe needle 508 and a signal port (or connecting port) 505 arranged to connect to the input port 208A and the testing tool 502, respectively. Similarly, referring to FIG. 5C, the probe assembly 504 is caused to connect to the output port 209A and the testing tool 522. In some embodiments, the probe assembly 504 includes the probe needle 508 and the signal port 505 arranged to connect to the output port 209A and the testing tool 522, respectively. The relative step is shown in step S604 of FIG. 6.

In some embodiments, referring to FIG. 5B, the testing tool 502 for testing the RF device 2081 includes at least one or more of a signal generator and a spectrum analyzer. The testing tool 502 may alternatively include a network analyzer. In some embodiments, the testing tool 502 includes an ideal voltage source $V_T$ having an input impedance $Z_T$. In some embodiments, the input impedance $Z_T$ is substantially equal to 50 ohm. In some embodiments, the probe assembly 504 includes a transmission line 506 connected to a probe needle 508 and the signal port 505 in series connection. The probe assembly 504 is connected to the RF device 2081 through a physical contact with the input port 208A by the probe needle 508.

Figure 5C:
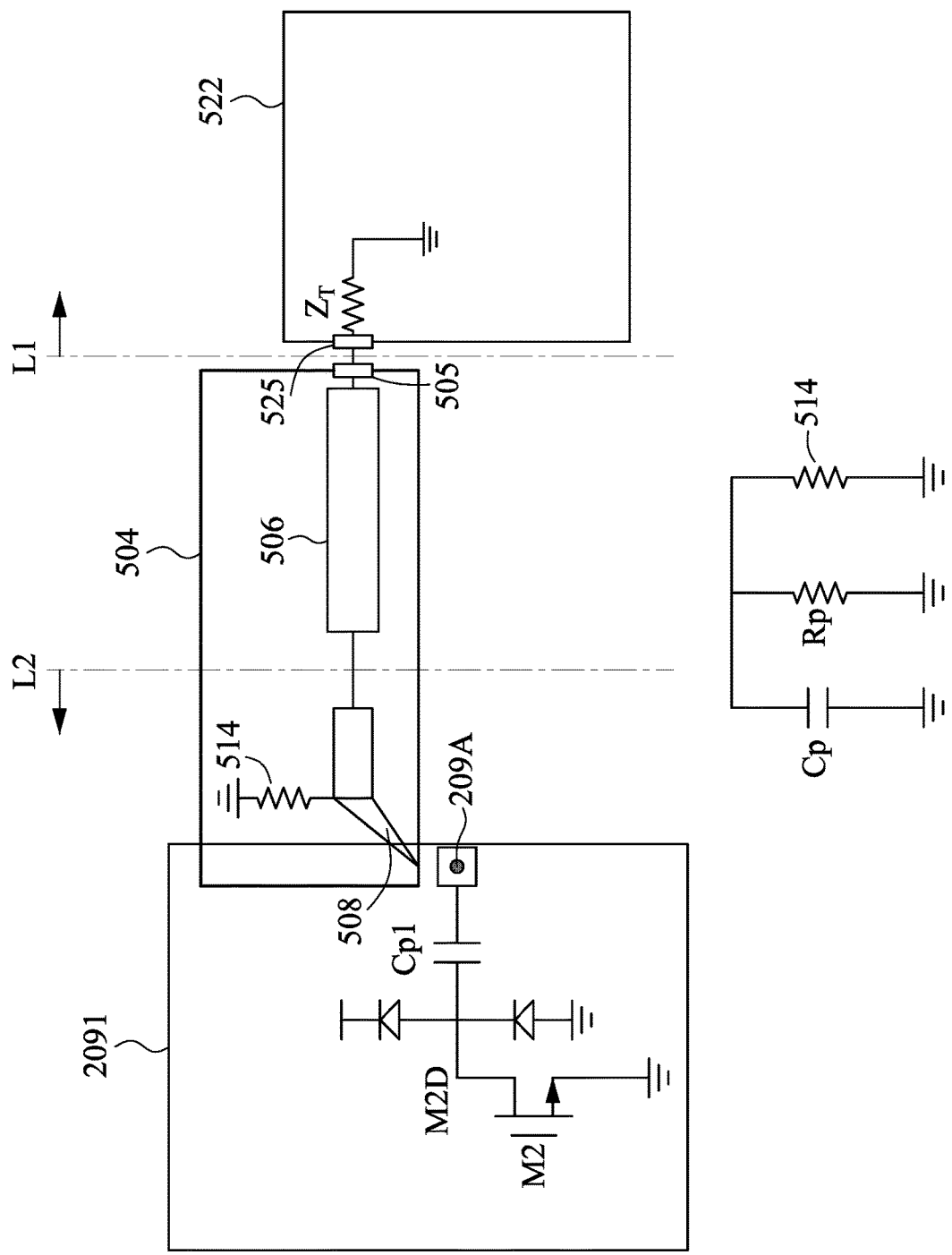
Figure 6:
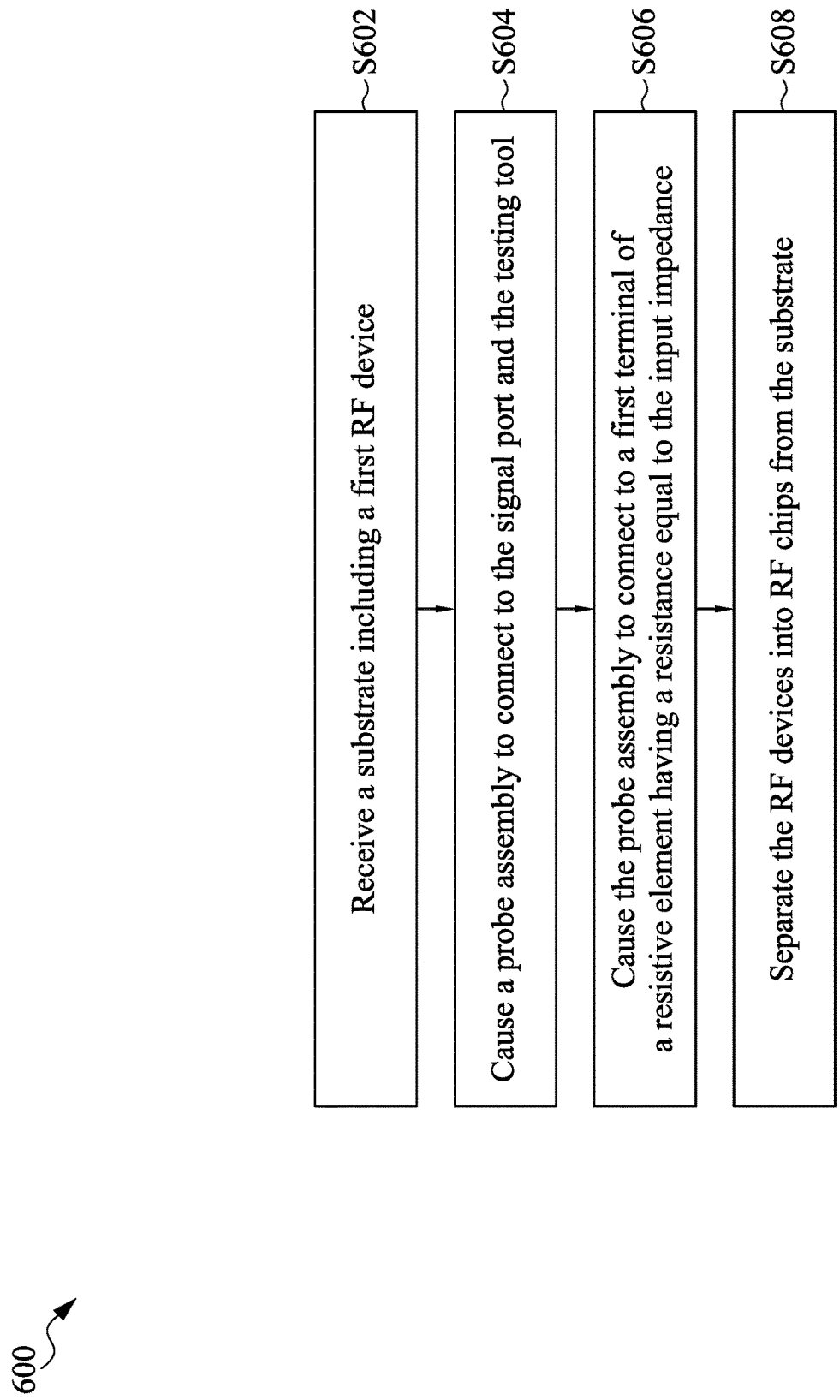
FIG. 6 is a schematic flowchart of the method of manufacturing the phased array antenna shown in FIGS. 5A to 5D, in accordance with some embodiments.

Referring to FIG. 5C, the testing tool 522 for testing the RF device 2091 at least includes one or more of a signal generator and a spectrum analyzer. The testing tool 522 may alternatively include a network analyzer or a noise figure analyzer. In some embodiments, the testing tool 522 includes an input impedance $Z_T$ looking into the testing tool 522 from a signal port (or connecting port) 525 of the testing tool 522. In some embodiments, the input impedance $Z_T$ is substantially equal to 50 ohm. The probe assembly 504 is connected to the RF device 2091 through a physical contact with the output port 209A by the probe needle 508.

Referring to the FIGS. 3D and 5B or FIGS. 4D and 5C, the probe assembly 504 sees an input impedance $Z_T$ of the testing tool 502 or 522 from the boundary line L1 between the probe assembly 504 and the testing tool 502. The probe assembly 504 also sees an output impedance Rp from the boundary line L2 between the probe assembly 504 and the RF device 2081 or 2091. As discussed previously, the input impedance Rp is at least ten times (10×) the input impedance $Z_T$. As a result, the input impedances Rp and $Z_T$ does not match each other for the probe assembly 504. As a result, standing waves or signal reflections may occur during the testing operation, and the testing result may not be accurate.

Referring also to FIGS. 5B and 5C, the probe assembly 504 is further caused to connect to a first terminal of a resistive element 514. The resistive element 514 couples to the probe needle 508 in parallel connection to make the input impedance looking into the probe assembly 504 from the testing tool 502 or 522 substantially equal to the input impedance $Z_T$ looking into the testing tool 502 or 522 from the probe assembly 504. The resistive element 514 has a resistance $Z_T$ substantially equal to the input impedance $Z_T$ of the testing tool 502 or 522. The relative step is shown in step S606 of FIG. 6. In some embodiments, the resistive element 514 has a second terminal connected to a reference voltage, e.g., ground. Referring to the lower subfigures of FIGS. 5B and 5C, the probe assembly 504 sees an output impedance of the RF chip 2081 or 2091 from the boundary line L2 to be the parallel connection of the input impedance Rp and the resistive element 514. Since the input impedance Rp is relatively much greater than the resistance $Z_T$ of the resistive element 514 by at least ten times (10×), the resulting effective resistance would be substantially equal to the resistance $Z_T$ of the resistive element 514, which is substantially equal to the input impedance $Z_T$ of the testing tool 502 or 522. As a result, the impedance matching on two sides of the transmission line 506 of the probe assembly 504 is achieved to be equal to $Z_T$, and the testing performance of the testing tool 502 or 522 can be maintained.

Figure 5D:
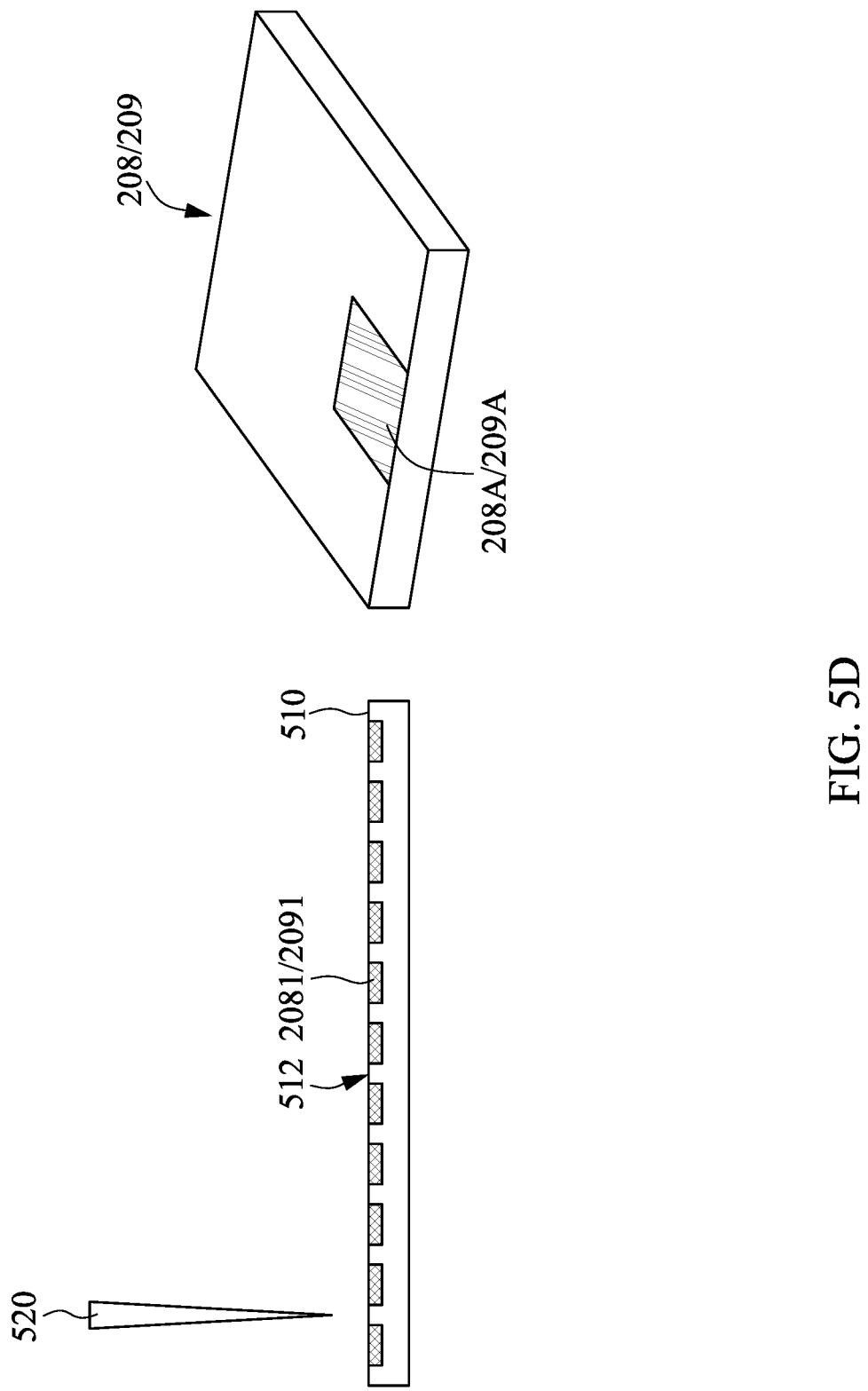

Referring to FIG. 5D, the plurality of RF devices 2081 or 2091 are separated from the substrate 510 into individual RF chips 208 or 209. The relative step is shown in step S608 of FIG. 6. The separating operation may be performed by a dicing tool 520, such as a dicing blade or a dicing laser. In some embodiments, the individual RF chips 208 or 209 are bonded to the substrate 202 and the interconnect structure 204 to form the transmitter 100 or the receiver 101. In some embodiments, a packaging operation is performed on the RF chips 208 or 209 to form the transmitter 100 or the receiver 101.

FIGS. 7A to 7F are schematic block diagrams of intermediate stages of a method of manufacturing and testing a phased array antenna of the transmitter 100 or the receiver 101, in accordance with some embodiments. FIG. 6 shows the method 600 of manufacturing and testing the phased array antenna shown in FIGS. 7A to 7F, in accordance with some embodiments. It shall be understood that additional steps can be provided before, during, and after the steps in method 600, and some of the steps described below can be replaced with other embodiments or eliminated. The order of the steps shown in FIG. 7A to 7F or in FIG. 6 may be interchangeable. Some of the steps may be performed concurrently or independently.

Figure 7A:
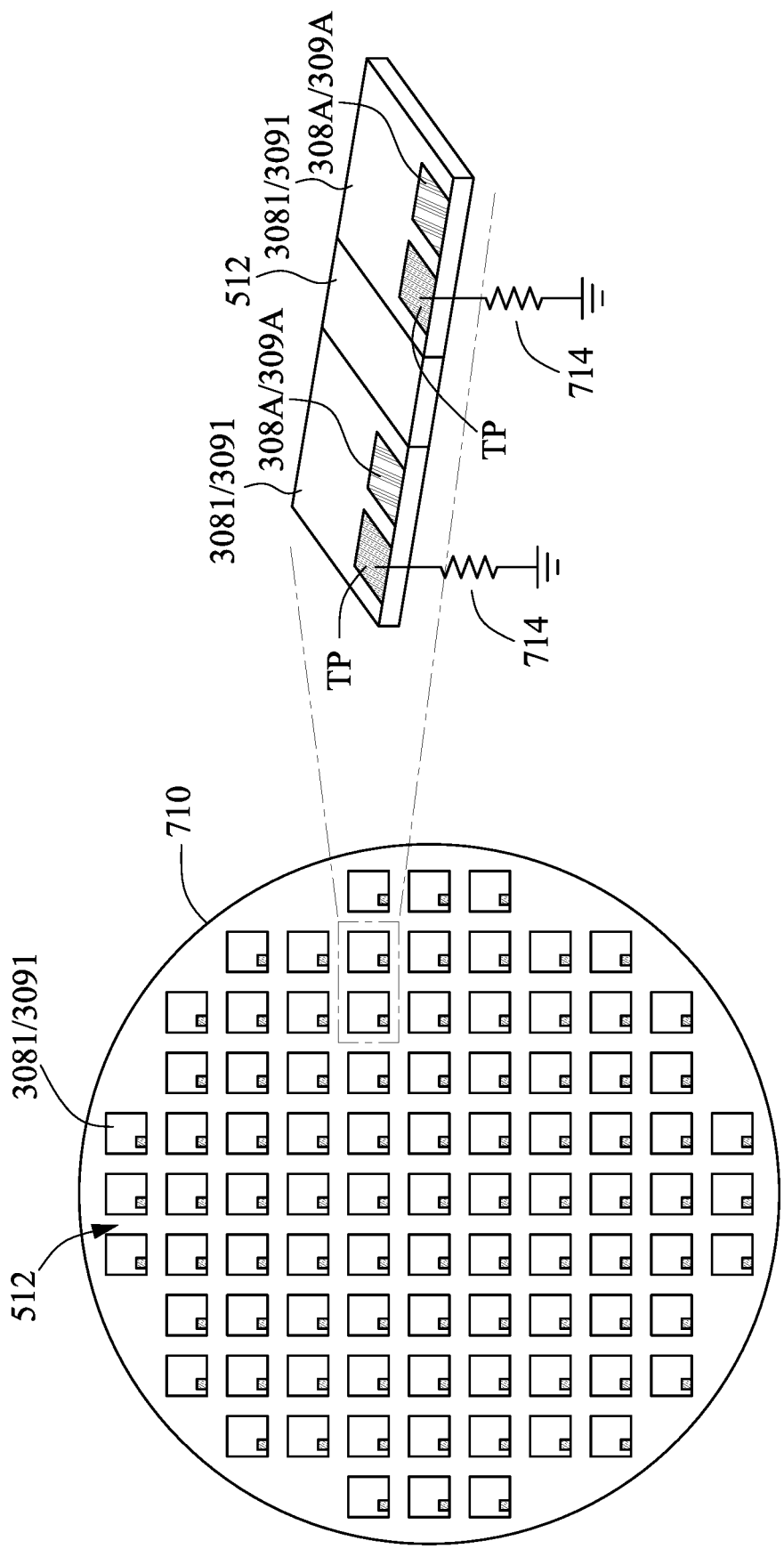
FIGS. 7A to 7F are schematic block diagrams of intermediate stages of a method of manufacturing an antenna array, in accordance with some embodiments.

In some embodiments, the manufacturing of the phased array antenna includes fabrication of the phased array antenna, followed by a testing operation of the fabricated phased array antenna to ensure the integrity of the phased array antenna. Referring to FIG. 7A, a substrate 710 including a first RF device 3081 or 3091 is received. In some embodiments, the first RF device 3081 or 3091 having a signal (input or output) port 308A or 309A (see the enlarged view of the first RF device 3081 or 3091 of FIG. 7A) is received. The relative step is shown in step S602 of FIG. 6. In some embodiments, the first RF device 3081 or 3091 are formed in an array on an upper surface of the substrate 710. In some embodiments, the plurality of RF devices 3081 or 3091 are separated and defined by scribe line areas 512. In some embodiments, the scribe line areas 512 include testing patterns or testing ports, e.g., a resistive element, configured to perform testing on the plurality of RF devices 3081 or 3091 after the RF devices 3081 or 3091 are formed. In some embodiments, each of the RF devices 3081 or 3091 has an input port 308A or output port 309A for receiving or transmitting RF signals with an input impedance Rp, through looking into the RF devices 3081 or 3091 via the signal port 308A or 309A, greater than ten times an input impedance $Z_T$ of a testing tool, e.g., the testing tool 502 shown in FIG. 5B.

In some embodiments, the input port 308A of the RF device 3081 is used in an RF transmitter, and the output port 309A of the RF device 3091 is used in an RF receiver. Further, the RF devices 3081 and 3091 are similar to the RF devices 2081 and 2091, respectively, shown in FIGS. 3C and 4C, respectively, except that the RF devices 3081 and 3091 further includes a testing port TP and a resistive element 714. The resistive element 714 is connected to a probe assembly during a testing operation, and after the RF chip 308 or 309 are formed on the transmitter block 310 or the receiver block 311, the resistive element 714 may not serve any other functions during the normal operation of the RF chips 308 or 309. In some embodiments, the resistive element 714 has a first terminal connected to the testing port TP and a second terminal connected to a reference voltage, e.g., ground.

Figure 7B:
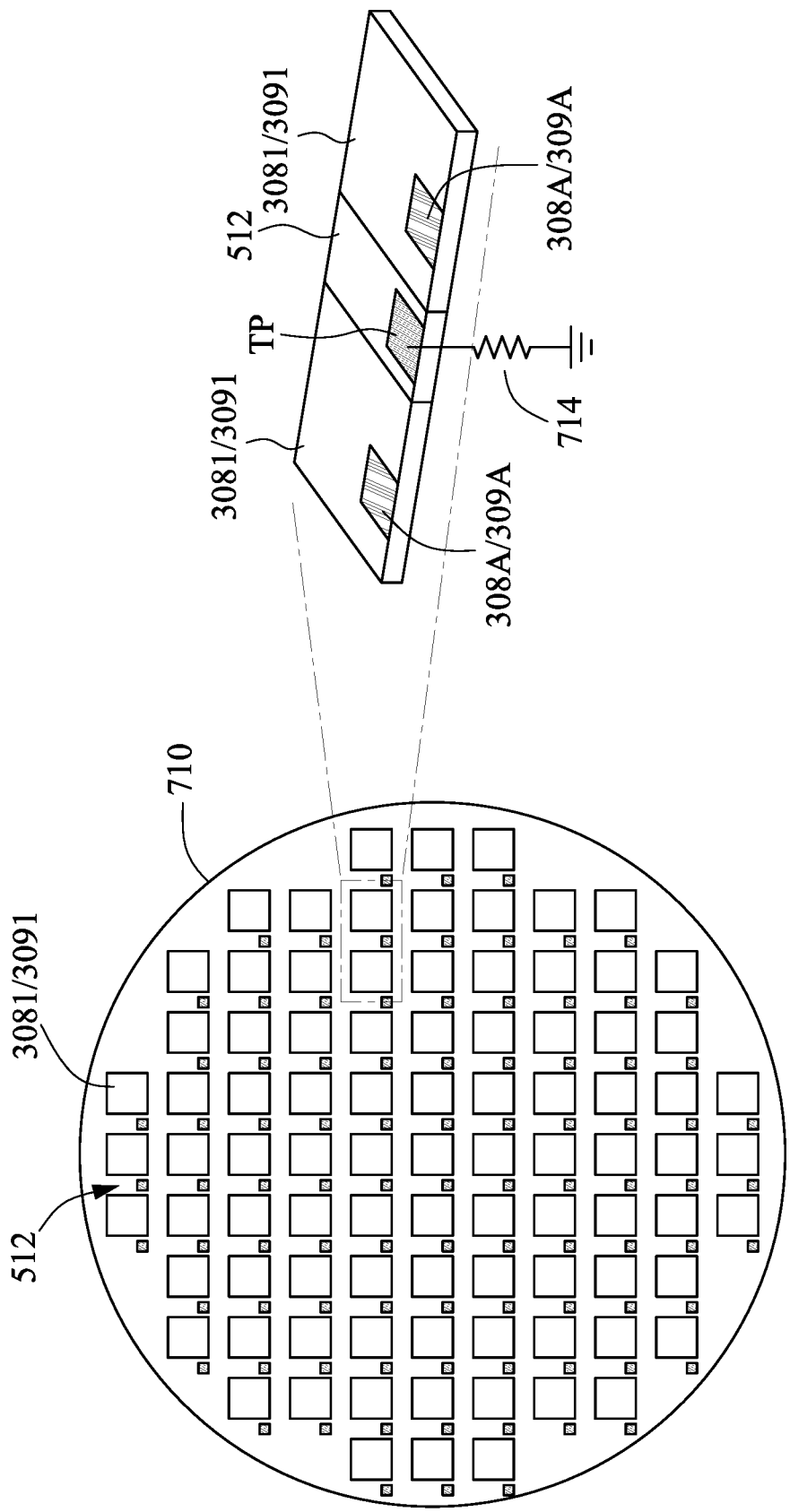

Alternatively, in some embodiments, as shown in FIG. 7B, the testing port TP and the resistive element 714 for the respective RF devices 3081 or 3091 are formed in a region of the scribe line area 512. The resistive element 714 is connected to a probe assembly during a testing operation, and may be removed during a dicing operation of the RF devices 3081 or 3091. In some embodiments, the resistive element 714 has a first terminal connected to the testing port TP and a second terminal connected to a reference voltage, e.g., ground.

Figure 7C:
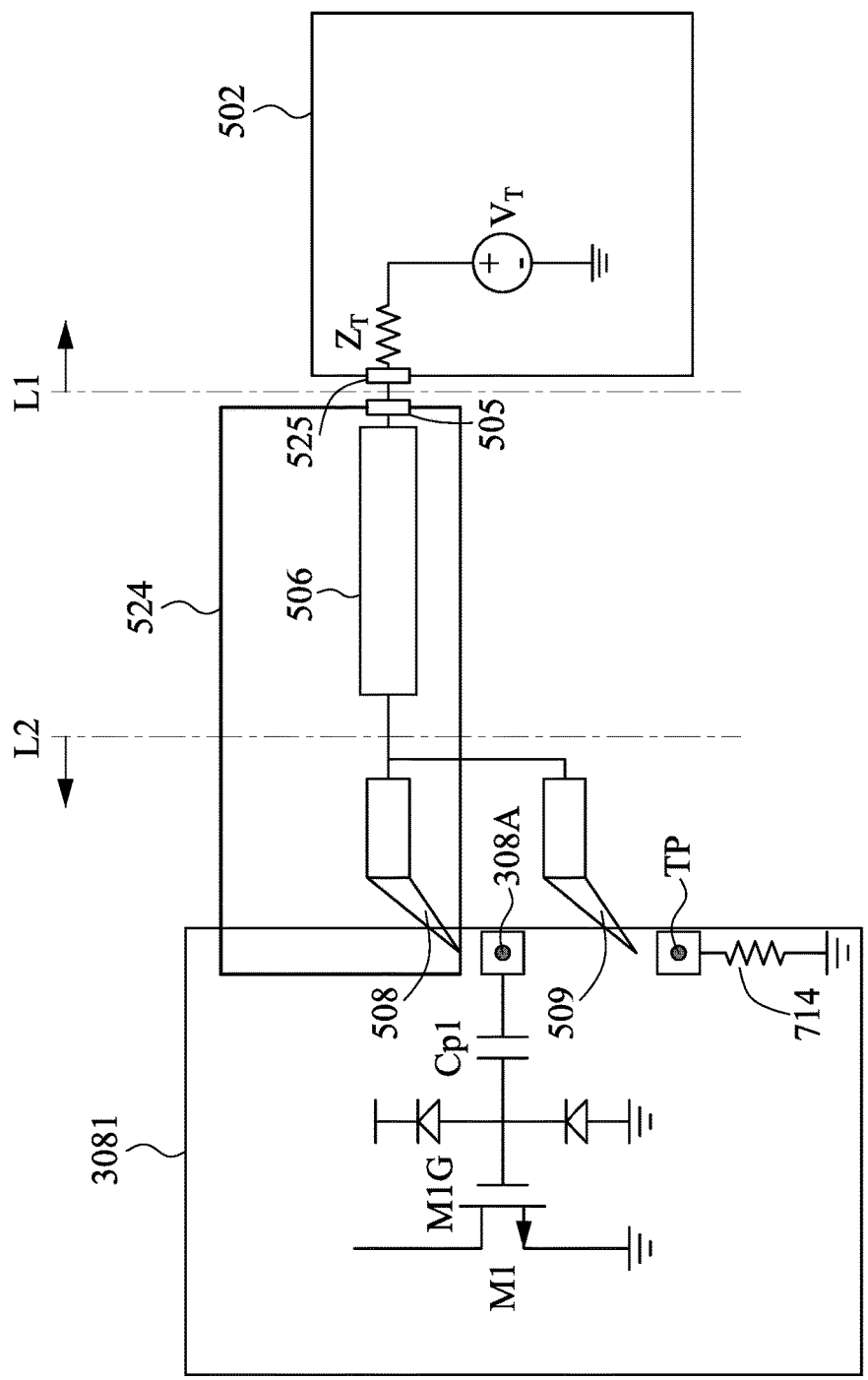

Referring to FIG. 7C, a probe assembly 524 is caused to connect to the input port 308A of the RF device 3081 and the testing tool 502 through the probe needle 508 and the signal port 505, respectively, for testing the RF device 3081 or 3091. The probe assembly 524 is further caused to connect to a first terminal of the resistive element having a resistance or an impedance substantially equal to the input impedance $Z_T$. In some embodiments, probe needle 508 of the probe assembly 504 is arranged to couple to the signal port 505 of the testing tool 502. In some embodiments, the testing tool 522 is arranged to couple to the probe assembly 524 for testing the first RF device 3081 or 3091 through the probe assembly 524. The relative step is shown in steps S604 and S606 of FIG. 6. The probe assembly 524 includes a first probe needle 508 and a second probe needle 509 configured to probe the input port 308A and the testing port TP, respectively, during a testing operation. In some embodiments, the probe assembly 524 is connected to the RF device 2081 through a physical contact with the input port 308A and the testing port TP by the first probe needle 508 and the second probe needle 509, respectively.

Figure 7D:
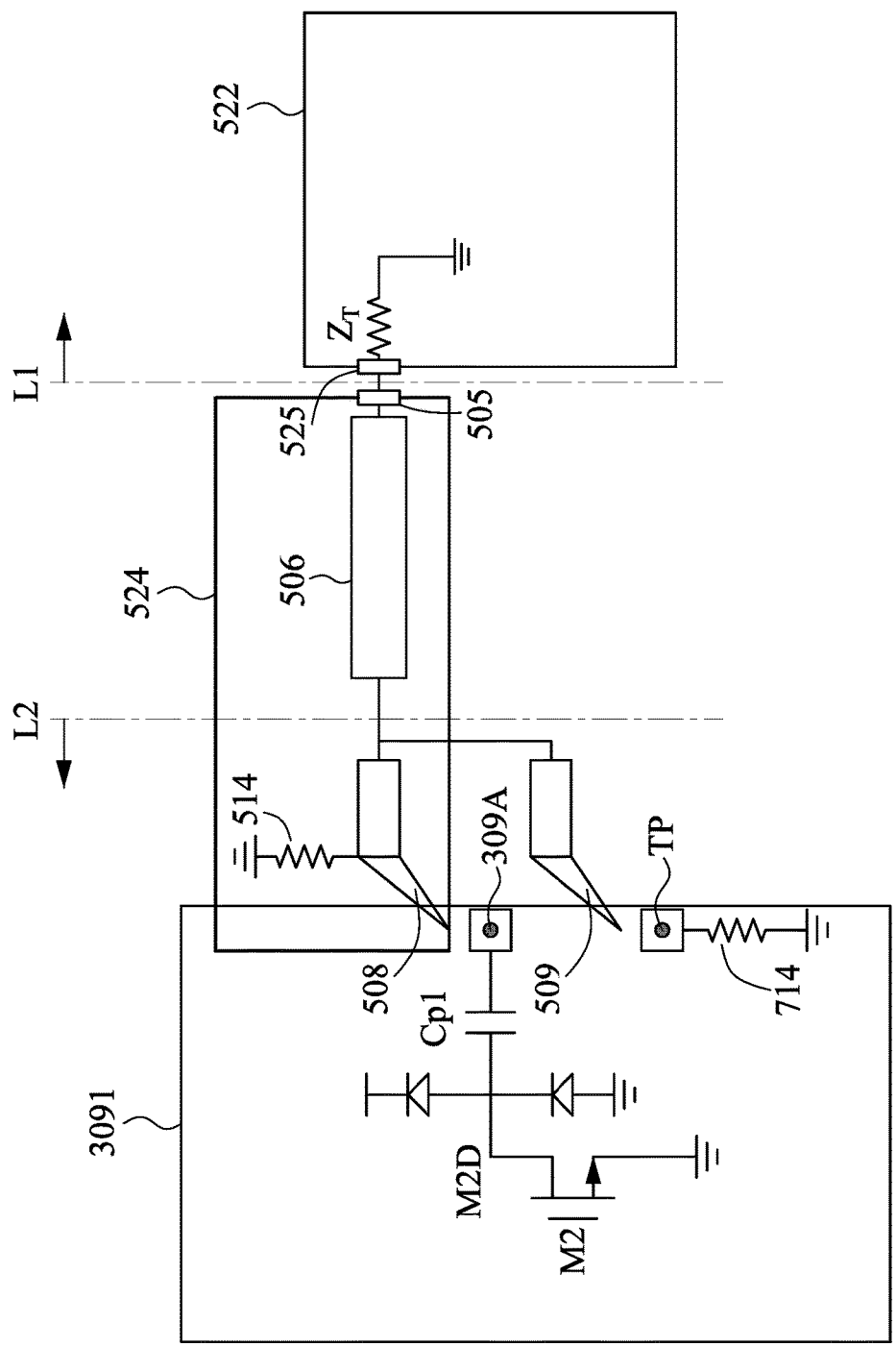

Similarly, referring to FIG. 7D, the probe assembly 524 is caused to connect to an output port 309A of the RF device 3091 and the testing tool 522 through the probe needle 508 and the signal port 505, respectively. In some embodiments, the (first) probe needle 508 of the probe assembly 524 is arranged to couple to the signal port 505 of the testing tool 502. In some embodiments, the testing tool 522 is arranged to couple to the probe assembly 524 for testing the first RF device 3081 or 3091 through the probe assembly 524. The probe assembly 524 is further caused to connect to a first terminal of the resistive element 714 having a resistance or an impedance substantially equal to the input impedance $Z_T$. The relative step is shown in steps S604 and S606 of FIG. 6. The probe assembly 524 includes the first probe needle 508 and a second probe needle 509 configured to probe the output port 309A and the testing port TP, respectively, during a testing operation. Further, the probe assembly 524 is connected to the RF device 3091 through a physical contact with the output port 309A and the testing port TP by the first probe needle 508 and the second probe needle 509, respectively.

Referring to FIGS. 7C and 7D, during a testing operation, the input impedance Rp is in parallel connection with the resistive element 714 by the contacting of the probe assembly 524 through the first probe needle 508 and the second probe needle 509, respectively. The resistive element 714 couples to the probe needle 509 in parallel connection to make the input impedance looking into the probe assembly 524 from the testing tool 502 or 522 substantially equal to the input impedance $Z_T$ looking into the testing tool 502 or 522 from the probe assembly 524. Since the input impedance Rp, which is determined through looking into the signal port 308A or 309A of the RF device 3081 or 3091 from the probe needle 508, is relatively much greater than the resistance of the resistive element 714 by at least ten times, the resulting effective resistance would be substantially equal to the resistance of the resistive element 714, which is substantially equal to the input impedance $Z_T$ of the testing tool 502 or 522. As a result, the impedance matching on two sides of the transmission line 506 of the probe assembly 524 is achieved to be equal to $Z_T$, which leads to the same effect as that achieved by the configuration of the on-probe resistive element 514 shown in FIGS. 5B and 5C. The testing performance of the testing tool 502 or 522 can be maintained accordingly.

Figure 7E:
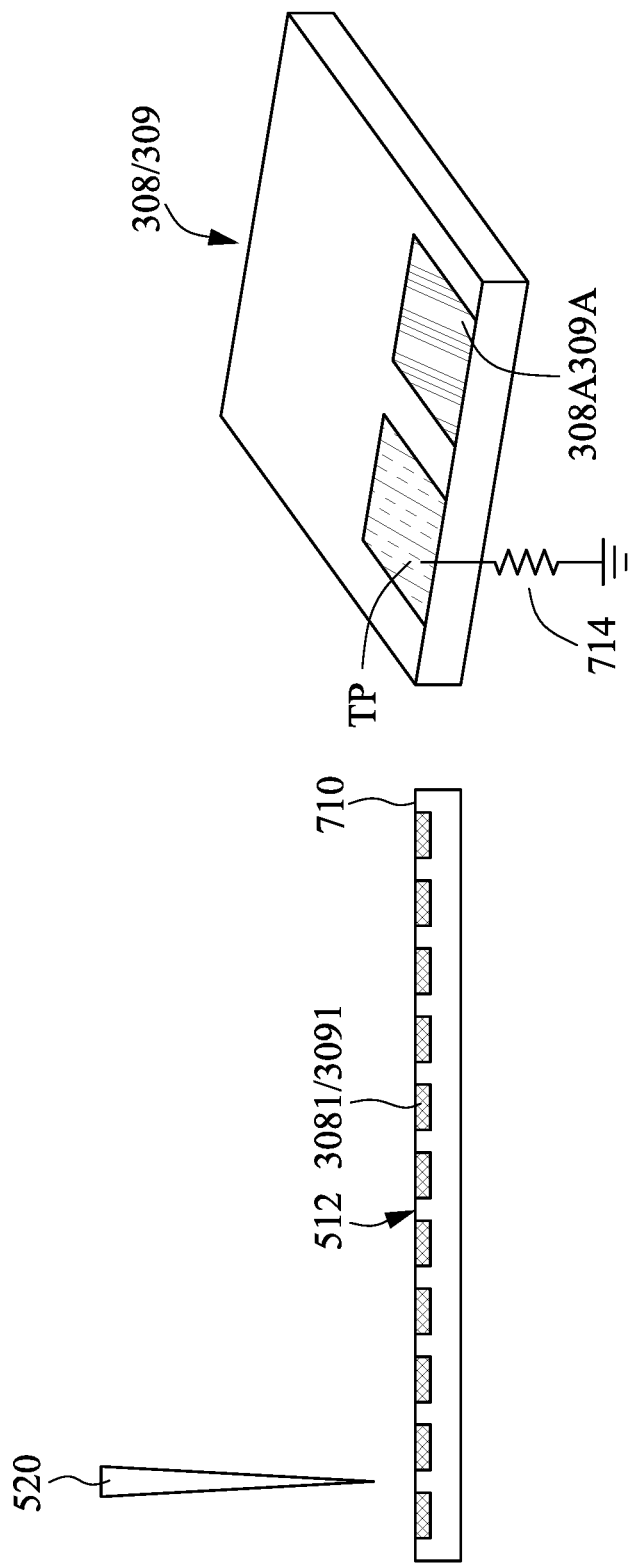

Referring to FIG. 7E, the RF devices 3081 or 3091 are separated from the substrate 710 into individual RF chips 308 or 309. The relative step is shown in step S608 of FIG. 6. The separating operation may be performed by a dicing tool 520, such as a dicing blade or a dicing laser to cut through the substrate 710 along the scribe line areas 512. In some embodiments, the individual RF chips 308 or 309 are bonded to the substrate 202 and the interconnect structure 204 to form the transmitter 100 or the receiver 101. In some embodiments, a packaging operation is performed on the RF chips 308 or 309 to form the transmitter 100 or the receiver 101. The resistive element 714 and the testing port TP are retained in the respective RF chip 3081 or 3091 after the formation of the transmitter 100 or the receiver 101 is completed.

Figure 7F:
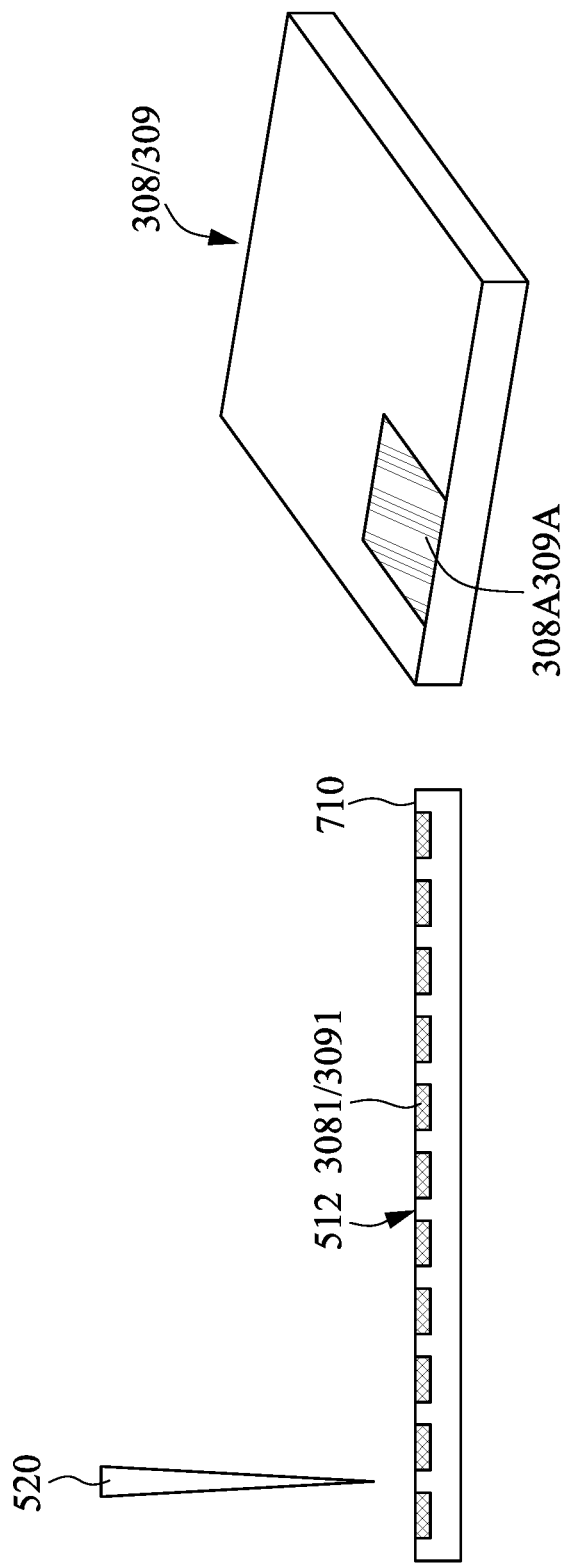

Alternatively, as shown in FIG. 7F, the RF devices 3081 or 3091 are separated from the substrate 710 into individual RF chips 308 or 309. The relative step is shown in step S608 of FIG. 6. The resistive element 714 and the testing port TP may be removed along with the removal of the scribe line areas 512 during the dicing operation. As a result, the resistive element 714 and the testing port TP are no longer included in the respective RF chip 3081 or 3091 after the formation of the transmitter 100 or the receiver 101 is completed.

Figure 8A:
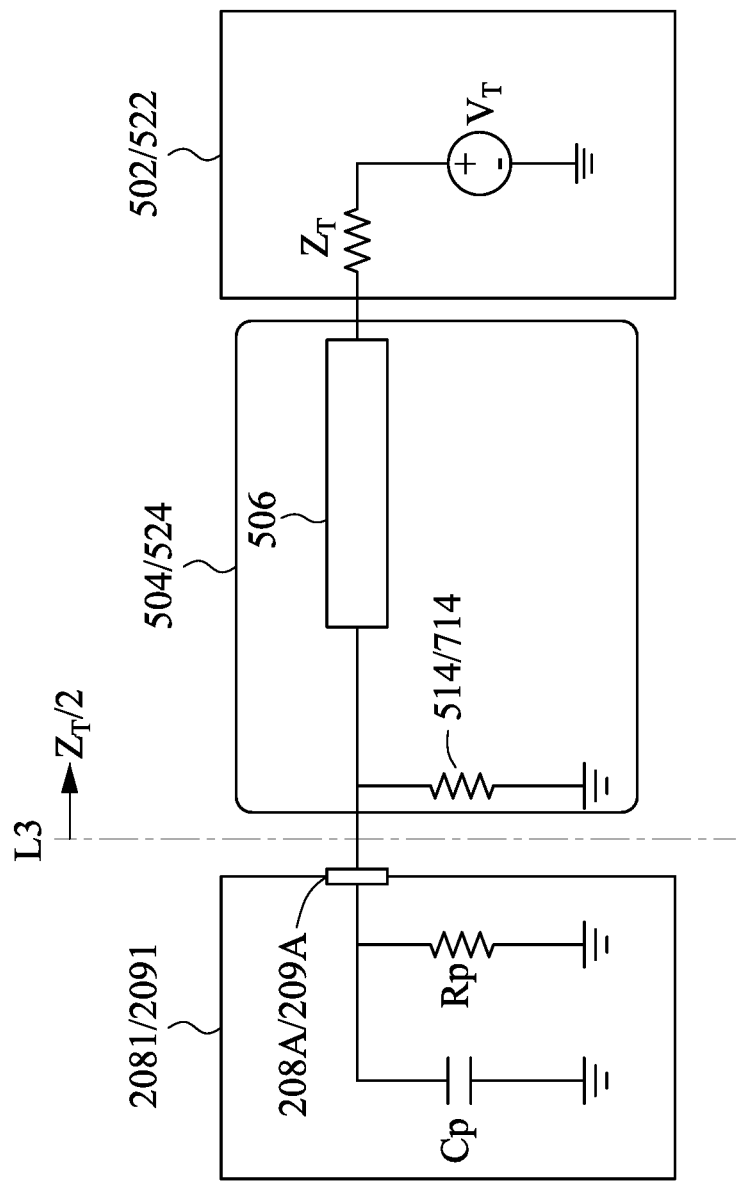
FIGS. 8A and 8B are schematic block diagrams showing different circuit contexts seen by an RF chip when the RF chip is arranged in a substrate or in an antenna element, respectively, in accordance with some embodiments.
Figure 8B:
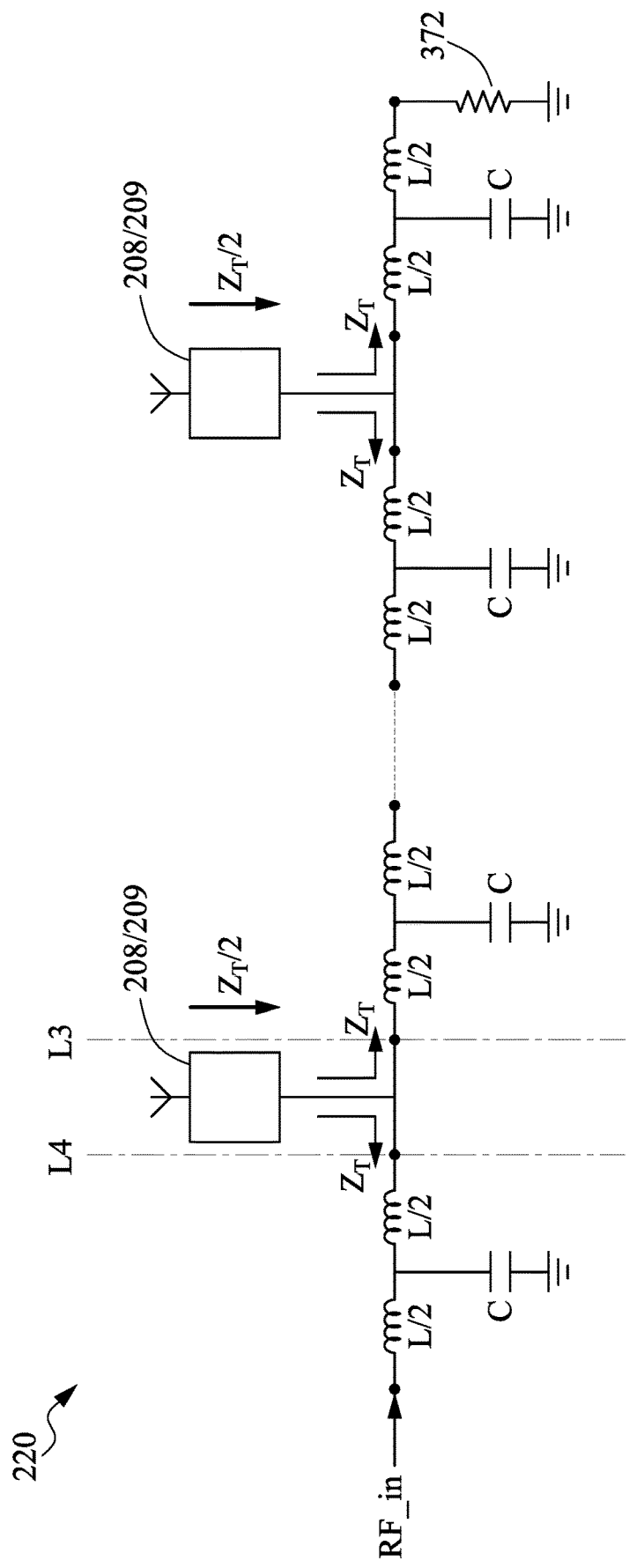

FIGS. 8A and 8B are schematic block diagrams showing different circuit contexts seen by an RF chip 2081 or 2091 when the RF device 2081 or 2091 is arranged in a substrate 510/710 or in an antenna element 200A, respectively, in accordance with some embodiments. As discussed previously, the input impedance, e.g., Rp, of the RF chip 208 or 209 is not matched with the input impedance $Z_T$ of the testing tool 502 or 522, respectively. Also, the impedance of the transmission line 220 shown in FIGS. 3C and 4C has not been taken into consideration when the RF device 2081 or 2091 is subjected to the testing operation before being diced, as shown in FIGS. 5A-5C and 7A-7D, respectively. Thus, it is necessary to examine whether the testing contexts, or the input impedance seen by the individual RF device 2081/3081 or 2091/3091 when formed on the substrate 510 or 710 is equal to that seen by the individual RF chip 208 or 209 diced and bonded to the transmitter 100 or the receiver 101.

Referring to FIGS. 3D, 4D and 8A, the output impedance of the RF device 2081 or 2091 can be represented by an equivalent circuit of the capacitor Cp in parallel connection with the input impedance Rp. The probe assembly 504 or 524 is arranged to connect the RF device 2081 or 2091 to the testing tool 502 or 522. The resistive element 514 or 714 may serve the same function in the equivalent circuit shown in FIG. 8A, be it an embedded resistive element 514 of the probe assembly 504, or an on-chip resistive element 714 in the RF device 2081 or 2091. As discussed earlier, the resistance of the resistive element 514 or 714 is equal to the input impedance $Z_T$ of the testing tool 502 or 522, and is usually equal to about 50 ohm. As a result, the output impedance of seen by the RF device 2081 or 2091 from the input/output port 208A/209A at the boundary line L3 between the RF device 2081/2091 and the probe assembly 504/524 is equal to the resistance of the resistive element 514/714 in parallel connection with the input resistance $Z_T$, and is equal to $Z_T/2$, or generally may be 25 ohm.

Referring to FIGS. 3C, 4C and 8B, when the RF chip 208 or 209 is obtained from the RF device 2081 or 2091 through being diced or separated from the substrate 510 or 710 and connected to the transmission line 220, the output impedance seen by the RF chip 208 or 209 from the input/output port 208A/209A of the RF chip 208 or 209 is attributed to the equivalent impedance of the line segments of the transmission line 220 connected to the individual RF chip 208/209. In some embodiments, when the RF chips 2081 are connected to the transmission line 220 with relatively high impedance as compared to the resistive element 372, the impedance of each segment in the transmission line 220 can be regarded as equal to the resistance of the resistive element 372, i.e., $Z_T$. As a result, as far as each individual RF chip 208 or 209 is concerned, the RF chip 208 and 209 sees a parallel connection of two segments of the transmission line 220, in which one segment is connected to the signal input port for the RF signal RF_in, while the other segment is connected to the resistive element 372. In some embodiments, each segment of the transmission line 220 is represented by an equivalent inductor-capacitor (LC) circuit formed of a capacitor with capacitance C and an inductor with inductance L/2. As a result, the effective output impedance seen by the RF chip 208 or 209 is equal to the parallel connection of two segments each having a resistance $Z_T$, and the effective output impedance is equal to $Z_T/2$.

Based on the foregoing, it can be seen that the impedance seen by the RF device 2081 or 2091 before bonded to the transmission line 220 is substantially equal to that of the RF chip 208 or 209 after being bonded to the transmission line 220. As a result, the circuit contexts in the testing scenario proposed in FIG. 5A-5C or 7A to 7D provides a virtually identical impedance matching environment for the RF chip 208 or 209 after bonding, and therefore the testing result of the on-substrate testing before the dicing operation can be applied to the testing result after dicing and bonding operations without bias or distortion.

Figure 9:
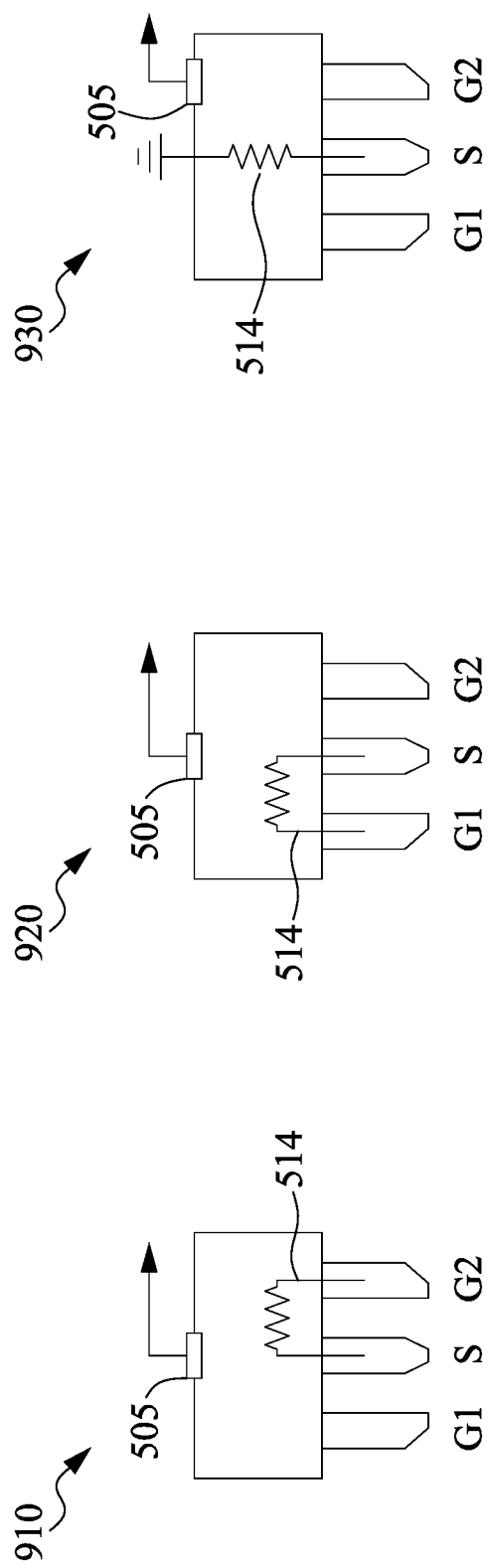
FIG. 9 shows schematic block diagrams of probe assemblies, in accordance with some embodiments.

FIG. 9 shows schematic block diagrams of probe assemblies 910, 920 and 930, in accordance with some embodiments. The probe assemblies 910, 920 and 930 may embed an impedance-matching resistive element, similar to the probe assembly 504 shown in FIG. 5B or 5C for a single-ended signal input application. In some embodiments, each of the probe assemblies 910, 920 and 930 includes three probe needles labeled as "G1". "S", and "G2", respectively. The probe needle labeled as "S" denotes a signal probing needle configured to connect to a signal input/output port, while the probe needles labeled as "G1" or "G2" denote a ground terminal configured to connect to a reference voltage, e.g., ground, of the device under test.

In some embodiments, each of the probe assemblies 910, 920 and 930 further includes an embedded resistive element 514 having the resistance $Z_T$. The connection configurations of the resistive element 514 may use different configurations in the probe assemblies 910 through 930. The resistive element 514 has a first terminal and a second terminal, wherein the first terminal is connected to the probe needle S, while the second terminal is either connected to the probe needle G1 in the probe assembly 910, connected to the probe needle G2 in the probe assembly 920, or connected to another reference voltage, e.g., ground, of the probe assembly 930 different form the probe needles G1 and G2. The probe assemblies 910, 920 and 930 may serve substantially the same functions of achieving impedance matching during the testing operation performed on the RF devices 208 or 209.

Figure 10:
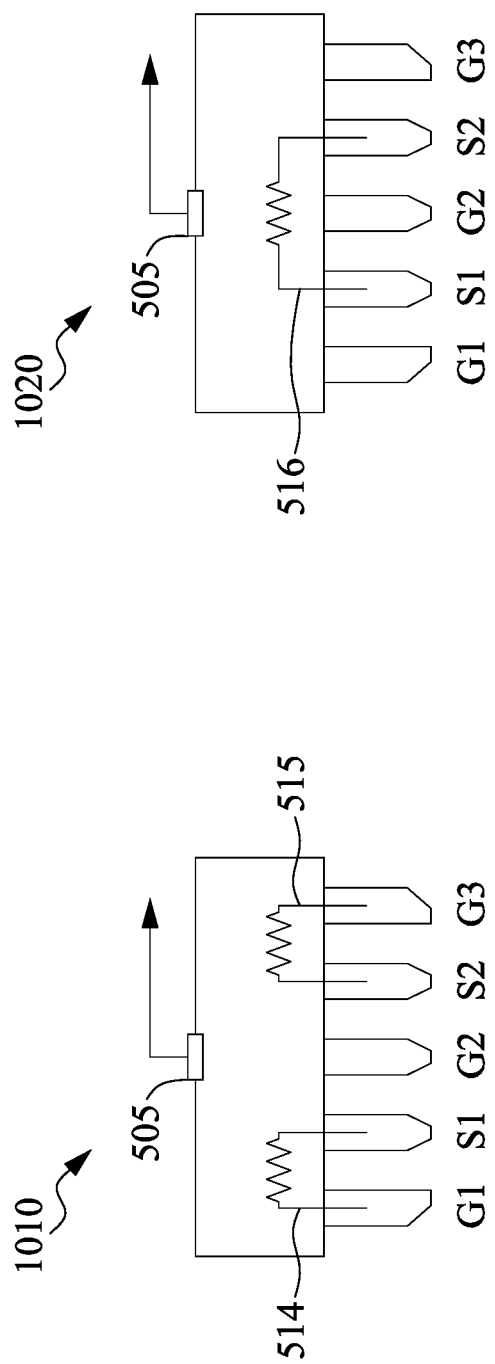
FIG. 10 shows schematic block diagrams of probe assemblies, in accordance with some embodiments.

FIG. 10 shows schematic block diagrams of probe assemblies 1010 and 1020, in accordance with some embodiments. The probe assemblies 1010 and 1020 may be similar to the probe assembly 504 shown in FIG. 5B or 5C and configured to receive a pair of differential signal inputs. In some embodiments, each of the probe assemblies 1010 and 1020 includes five probe needles labeled as "G1," "S1," "G2," "S2," and "G3," respectively. The probe needles labeled as S1 and S2 denote a pair of differential signal probing needles configured to connect to a pair of differential signal input/output ports, wherein the pair of differential signals may be transmitted in a form of equal amplitudes and opposite polarities. The probe needles labeled as G1, G2 or G3 denote ground terminals configured to connect to a reference voltage, e.g., ground, of the device under test.

In some embodiments, the probe assemblies 1010 further includes embedded resistive elements 514 and 515 each having the resistance $Z_T$. In some embodiments, each of the resistive elements 514 and 515 has a first terminal and a second terminal, wherein the first terminals are connected to the probe needles S1 and S2, respectively, while the second terminals are connected to the probe needle G1 and G3, respectively. In some other embodiments, the second terminals are connected to the probe needle "G2."

Alternatively, the probe assemblies 1020 further includes an embedded resistive elements 516. In some embodiments, the resistive element 516 has a first terminal and a second terminal connected to the probe needles "S1" and "S2", respectively. The resistive element 516 may have an effective resistance $2 \times Z_T$ since the second terminal of the resistive element 516 is connected to the probe needle "S2" to receive a signal with an amplitude equal to that received from the probe needle S1 and with an opposite polarity. The probe assemblies 1010 and 1020 may serve substantially the same function of achieving impedance matching during the testing operation performed on the RF devices 208 or 209.

Figure 11:
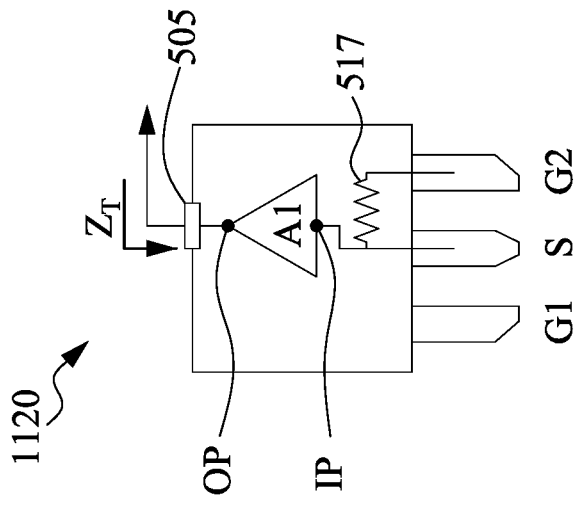
FIG. 11 shows schematic block diagrams of probe assemblies, in accordance with some embodiments.
Figure 11:
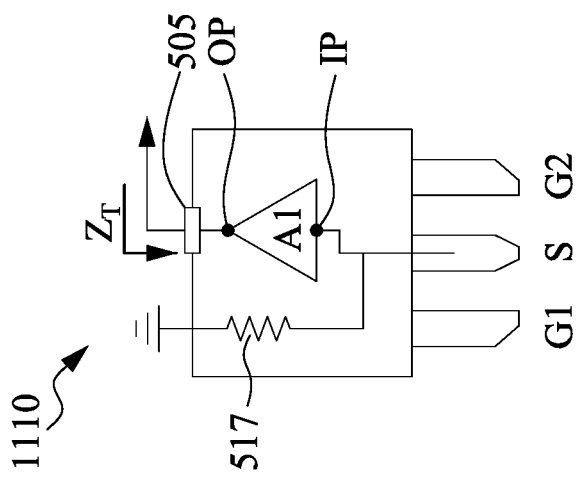

FIG. 11 shows schematic block diagrams of probe assemblies 1110 and 1120, in accordance with some embodiments. The probe assemblies 1110 and 1120 are similar to the probe assemblies 910 through 930 shown in FIG. 9, except that the probe assemblies 1110 and 1120 each further include an active device A1 in series connection with the probe needle S. In some embodiments, the active device A1 is coupled to the probe needle S and the signal port (connecting port) 505 in series. In some embodiments, the active device A1 includes an input IP coupled to the probe needle S and an output OP coupled to the signal port 505. In some embodiments, the active device A1 is an amplifier, such as an operational amplifier. In some embodiments, the active device A1 has an input impedance greater than ten times the input impedance $Z_T$ of the testing tool 502 or 522, and an output impedance substantially equal to $Z_T$. The probe assembly 1110 or 1120 includes a resistive element 517, wherein the resistive element 517 has a first terminal connected to the probe needle S. The resistive element 517 further includes a second terminal connected to a reference voltage, e.g., ground, through a ground terminal of the probe assembly 1110 different from the probe needles G1 and G2; or connected to the probe needle G1, or G2, as shown in the probe assembly 1120. Referring to FIGS. 8A, 8B and 11, the testing tool 502 or 522 would always see a constant effective impedance $Z_T$ provided by the active device A1 regardless of the circuitry on the other side of the active device A1, while the RF chip 2081 or 2091 has to see an effective output impedance of $Z_T/2$ for impedance matching. Therefore, the resistive element 517 has the effective resistance of one half of the input impedance $Z_T$, i.e., $Z_T/2$.

Figure 12:
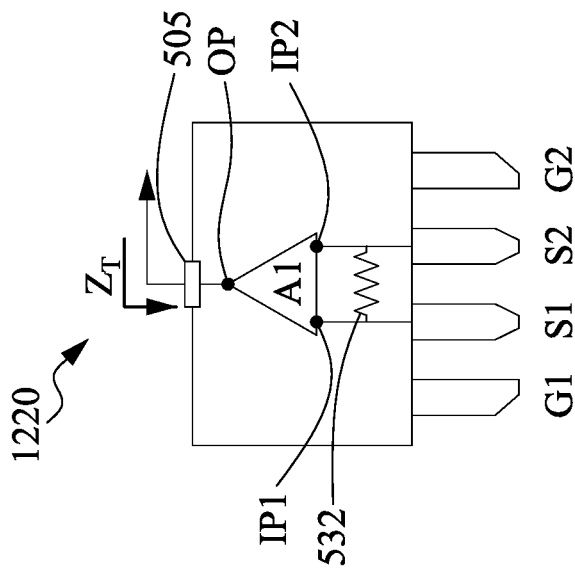
FIG. 12 shows schematic block diagrams of probe assemblies, in accordance with some embodiments.
Figure 12:
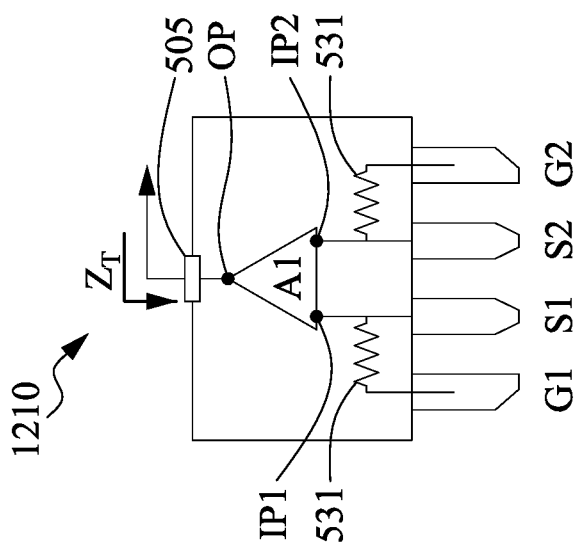

FIG. 12 shows schematic block diagrams of probe assemblies 1210 and 1220, in accordance with some embodiments. The probe assemblies 1210 and 1220 are similar to the probe assemblies 1010 and 1020 shown in FIG. 10, except that the probe assemblies 1210 and 1220 each further include an active device A1. The active device A1 includes two terminals connected to the probe needles S1 and S2 serving as a pair of differential signal inputs. In some embodiments, the active device A1 includes a first input IP1 and a second input IP2 coupled to the probe needles S1 and S2, respectively, and an output OP coupled to the signal port 505. In some embodiments, the probe assemblies 1210 further includes two embedded resistive elements 531. In some embodiments, each of the resistive elements 531 has a first terminal and a second terminal, wherein the first terminals are connected to the probe needles S1 and S2, respectively, while the second terminals are connected to the probe needle G1 and G2, respectively. In some embodiments, the left resistive element 531 is coupled to the probe needle S1 in parallel connection while the right resistive element 531 is coupled to the probe needle S2 in parallel connection. Following the analysis set forth with reference to the probe assemblies 1110 and 1120, the resistive elements 531 each have a resistance of $Z_T/2$.

In some embodiments, the probe assemblies 1220 includes an embedded resistive elements 532. In some embodiments, the resistive element 532 has a first terminal and a second terminal connected to the probe needles S1 and S2, respectively. Since the second terminal of the resistive element 532 is connected to the probe needle S2 to receive a signal with an amplitude equal to that received from the probe needle S1 and with an opposite polarity, the resistive element 532 may have an effective resistance twice that of the input impedance of the resistive element 531, i.e., the effective resistance of the resistive element 532 is equal to $Z_T$. The probe assemblies 1210 and 1220 may serve substantially the same functions of achieving impedance matching during the testing operation performed on the RF devices 208 or 209.

Based on the foregoing, the resistive elements 514, 515, 516, 517, 531 and 532 embedded in various probe assemblies 504, 910, 920, 930, 1010, 1020, 1110, 1120, 1210, and 1220 may have different resistance values for matching an impedance seen by the RF chip 2081 or 2091 in various circuit contexts. In some embodiments, the embedded individual resistive elements of the probe assembly 504 have a resistance value substantially no greater than 2 times the input impedance $Z_T$ of the testing tool 502 or 522, e.g., $2 \times Z_T$.

Figure 13:
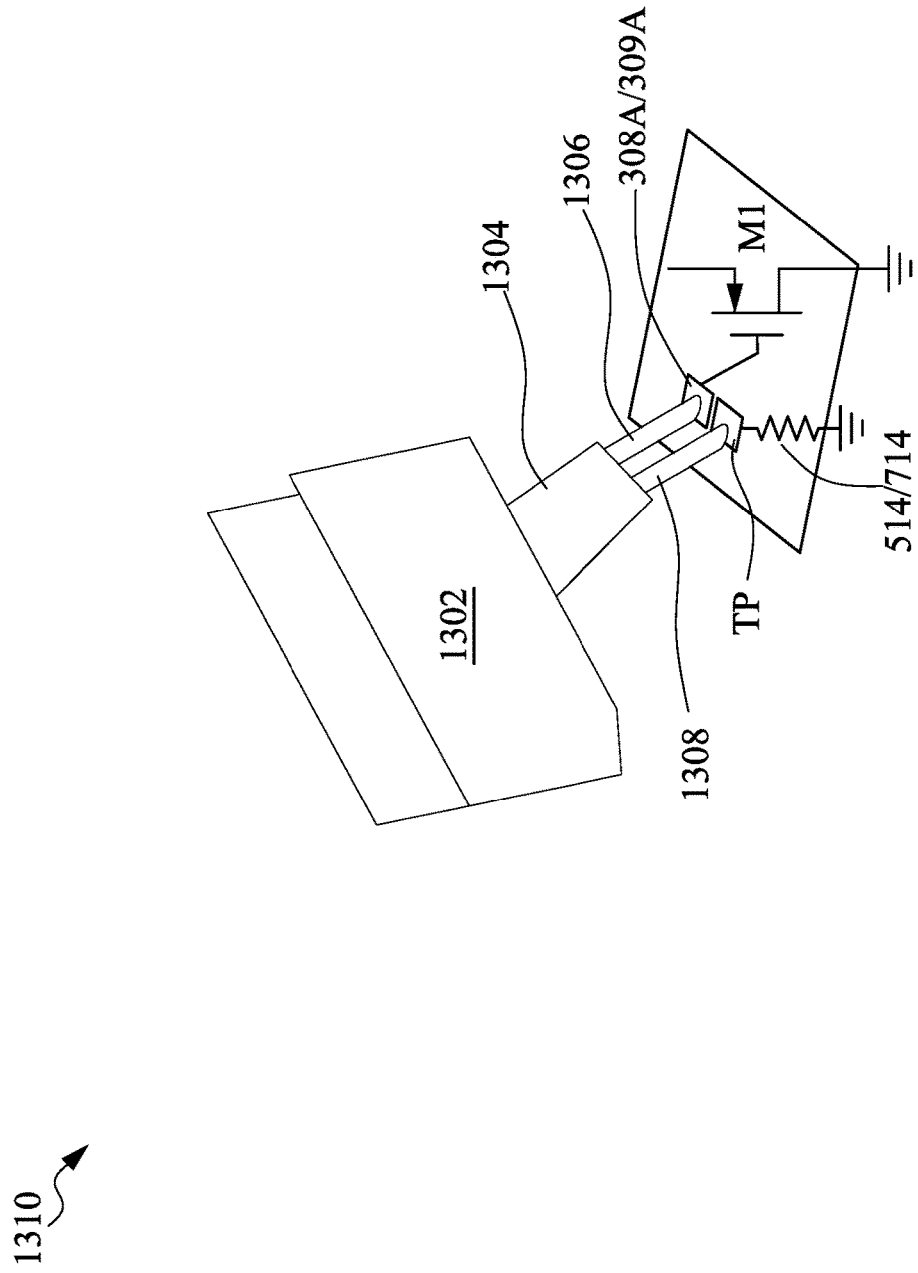
FIG. 13 is a schematic block diagram of a probe assembly, in accordance with some embodiments.

FIG. 13 is a schematic block diagram of a probe assembly 1310, in accordance with some embodiments. The probe assembly 1310 includes a body 1302, a protrusion 1304, and two probe needles 1306 and 1308. The probe needles 1306 and 1308 are configured to probe the input/output port 208A/209A or 308A/309A and the testing port TP, respectively, of the RF chip 2081, 2091, 3081 or 3091. In some embodiments, the probe assembly 1310 shows only probe needles for the input/output port 208A/209A or 308A/309A, and the testing port TP, and other probe needles for grounding is omitted. In some embodiments, the probe needles 1306 and 1308 are parallel to each other and closely arranged to each other in order to probe the closely arranged input/output port 208A/209A or 308A/309A and testing port TP. Other configurations using multiple probe needles closely arranged and sharing a common protrusion 1304 may also be within the contemplated scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for testing a first radio-frequency (RF) device, comprising:
   receiving the first RF device having a pair of differential signal ports including a first signal port and a second signal port for transmitting RF signals;
   arranging a first probe needle of a probe assembly to couple to the first signal port, wherein the probe assembly further comprises:
      a second probe needle configured to form a pair of differential probe needles with the first probe needle; and
      an active device comprising a first input terminal, a second input terminal and an output terminal, the first input terminal and the second input terminal coupled to the first probe needle and the second probe needle, respectively;
   arranging the second probe needle to couple to the second signal port;
   arranging a testing tool to couple to the output terminal for testing the first RF device through the probe assembly; and
   arranging a first terminal and a second terminal of a first resistive element to couple to the first probe needle and the second probe needle, respectively, to make a first input impedance looking into the probe assembly from the testing tool substantially equal to a second input impedance looking into the testing tool from the probe assembly.

2. The method of claim 1, wherein the first input impedance and the second input impedance are about 50 ohm.

3. The method of claim 1, wherein a third input impedance looking into the pair of differential signal ports from the probe assembly is at least ten times greater than the first input impedance and the second input impedance.

4. The method of claim 1, further comprising:
   configuring the first resistive element to have an impedance substantially equal to the first input impedance.

5. The method of claim 1, further comprising:
   embedding the first resistive element in the first RF device.

6. The method of claim 1, further comprising:
   embedding the first resistive element in the probe assembly.

7. The method of claim 1, wherein the active device is an amplifier.

8. A probe assembly for testing a radio-frequency (RF) device via a testing tool, the probe assembly comprising:
   a first probe needle configured to contact a first signal port of a pair of differential signal ports of the RF device;
   a second probe needle configured to form a pair of differential probe needles with the first probe needle and to contact a second signal port of the pair of differential signal ports;
   an active device having a first input terminal, a second input terminal and an output terminal, the first input terminal and the second input terminal coupled to the first and second probe needles respectively;
   a first connecting port configured to electrically connect the output terminal to a second connecting port of the testing tool; and
   a first resistive element comprising a first terminal and a second terminal configured to couple to the first probe needle and the second probe needle, respectively, wherein a first input impedance looking into the first connecting port substantially equal to a second input impedance looking into the second connecting port.

9. The probe assembly of claim 8, wherein the first input impedance is about 50 ohm.

10. The probe assembly of claim 8, wherein the first resistive element has an impedance substantially equal to the first input impedance.

11. The probe assembly of claim 8, wherein the active device is an amplifier.

12. The probe assembly of claim 8, wherein a third input impedance looking into the active device is at least ten times greater than the first input impedance and the second input impedance.

13. The probe assembly of claim 8,
   wherein the active device is coupled to the first probe needle and the first connecting port in series connection.

14. The probe assembly of claim 8, further comprising:
   a transmission line coupled to the active device and the first connecting port in series connection.

15. A probe assembly for testing a radio-frequency (RF) device via a testing tool, the probe assembly comprising:
   a first probe needle configured to contact a first signal port of a pair of differential signal ports of the RF device;
   a second probe needle configured to form a pair of differential probe needles with the first probe needle and to contact a second signal port of the pair of differential signal ports;
   a first connecting port configured to electrically connect to a second connecting port of the testing tool;
   a first resistive element configured to couple to the first probe needle in parallel connection;
   a second resistive element configured to couple to the second probe needle in parallel connection; and
   an active device having a first input terminal and a second input terminal coupled to the first and second probe needles respectively, and an output terminal coupled to the first connecting port.

16. A testing system comprising:
a radio-frequency (RF) device having a pair of different signal ports including a first signal port and a second signal port;
a probe assembly having:
- a first probe needle configured to couple to the first signal port;
- a second probe needle configured to form a pair of differential probe needles with the first probe needle and to contact the second signal port; and
- an active device having a first input terminal, a second input terminal and an output terminal, the first input terminal and the second input terminal coupled to the first and second probe needles respectively;

a testing tool having a first connecting port coupled to a second connecting port of the probe assembly, the testing tool used for testing the RF device through the probe assembly; and a resistive element comprising a first terminal and a second terminal configured to couple to the first probe needle and the second probe needle, respectively, wherein a first input impedance looking into the first connecting port substantially equal to a second input impedance looking into the second connecting port.

17. The testing system of claim 16, wherein the RF device has a third input impedance looking into the pair of differential signal ports, and the third input impedance is at least ten times greater than the first input impedance and the second input impedance.

18. The testing system of claim 16, wherein the resistive element is embedded in the probe assembly.

19. The testing system of claim 16, wherein the resistive element is embedded in the RF device.

20. The probe assembly of claim 16, wherein the active device is an amplifier.

* * * * *